United States Patent
Lee et al.

(10) Patent No.: US 9,147,640 B2
(45) Date of Patent: Sep. 29, 2015

(54) SEMICONDUCTOR DEVICES HAVING BACK SIDE BONDING STRUCTURES

(71) Applicant: Samsung Electronics Co., Ltd., Suwon-si (KR)

(72) Inventors: Woon-Seob Lee, Suwon-si (KR); Sin-Woo Kang, Suwon-si (KR); Yeong-Lyeol Park, Yongin-si (KR); Jang-Ho Kim, Incheon (KR); Ki-Young Yun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 62 days.

(21) Appl. No.: 13/957,018

(22) Filed: Aug. 1, 2013

(65) Prior Publication Data

US 2014/0084375 A1 Mar. 27, 2014

(30) Foreign Application Priority Data

Sep. 25, 2012 (KR) .................... 10-2012-0106599

(51) Int. Cl.
*H01L 21/70* (2006.01)
*H01L 23/48* (2006.01)
*H01L 21/768* (2006.01)
*H01L 23/522* (2006.01)
*H01L 23/00* (2006.01)

(52) U.S. Cl.
CPC ........ *H01L 23/481* (2013.01); *H01L 21/76898* (2013.01); *H01L 23/522* (2013.01); *H01L 24/05* (2013.01); *H01L 24/13* (2013.01); *H01L 2224/0401* (2013.01); *H01L 2224/05* (2013.01); *H01L 2224/0557* (2013.01); *H01L 2224/05571* (2013.01); *H01L 2224/131* (2013.01); *H01L 2224/16146* (2013.01); *H01L 2224/16227* (2013.01); *H01L 2924/00014* (2013.01)

(58) Field of Classification Search
CPC ................ H01L 2924/00; H01L 2924/0002; H01L 2924/1461; H01L 23/481; H01L 21/76898; H01L 2224/73204; H01L 2924/00014; H01L 2224/16145; H01L 24/16; H01L 21/76846; H01L 2224/13009; H01L 2224/13111
See application file for complete search history.

(56) References Cited

U.S. PATENT DOCUMENTS

| | | | |
|---|---|---|---|
| 6,677,235 | B1 | 1/2004 | Yegnashankaran et al. |
| 7,253,527 | B2 | 8/2007 | Tanida et al. |
| 7,432,196 | B2 | 10/2008 | Tanida et al. |
| 7,745,939 | B2 | 6/2010 | Sunohara et al. |

(Continued)

FOREIGN PATENT DOCUMENTS

| KR | 1020060054690 A | 5/2006 |
|---|---|---|
| KR | 1020080090826 A | 10/2008 |

*Primary Examiner* — Robert Bachner
(74) *Attorney, Agent, or Firm* — Myers Bigel Sibley & Sajovec

(57) ABSTRACT

Semiconductor devices are provided including an internal circuit on a front side of a substrate, the substrate defining a through-silicon via (TSV) structure extending vertically therein; a back side insulating layer on a back side of the substrate; and a back side bonding structure on the back side insulating layer. The TSV structure includes a front side end on a front side of the substrate and contacts the internal circuit and a back side end extending toward a back side of the substrate. The back side bonding structure includes a back side bonding interconnection portion on the back side insulating layer defining a back side bonding via hole therein and a back side bonding via plug portion in the contact plug hole in the back side insulating layer connected to a back side end of the TSV structure.

17 Claims, 36 Drawing Sheets

(56) References Cited

U.S. PATENT DOCUMENTS

| | | |
|---|---|---|
| 7,902,643 B2 | 3/2011 | Tuttle |
| 7,932,179 B2 | 4/2011 | Oliver et al. |
| 8,247,906 B2 | 8/2012 | Law et al. |
| 8,252,682 B2 | 8/2012 | Yang et al. |
| 8,362,599 B2 | 1/2013 | Kim et al. |
| 2011/0068466 A1* | 3/2011 | Chen et al. ................... 257/737 |
| 2011/0186990 A1* | 8/2011 | Mawatari et al. ............. 257/737 |
| 2012/0056330 A1* | 3/2012 | Lee et al. ...................... 257/774 |
| 2012/0112361 A1* | 5/2012 | Han et al. ...................... 257/774 |
| 2012/0199970 A1* | 8/2012 | Yun et al. ...................... 257/737 |

\* cited by examiner

SEMICONDUCTOR DEVICES HAVING BACK SIDE BONDING STRUCTURES

CROSS-REFERENCE TO RELATED APPLICATION

This application claims priority to Korean Patent Application No. 10-2012-0106599 filed on Sep. 25, 2012, the disclosure of which is hereby incorporated by reference as if set forth in its entirety.

FIELD

The inventive concept relates generally to semiconductor devices and, more particularly, to semiconductor devices having a through-silicon via (TSV) structure and a back side bonding structure.

BACKGROUND

Technology for forming through-silicon via (TSV) structures and back side bonding structures has been suggested to increase a degree of integration in semiconductor devices and electronic systems.

SUMMARY

Some embodiments of the present inventive concept provide semiconductor devices including an internal circuit on a front side of a substrate, the substrate defining a through-silicon via (TSV) structure extending vertically therein; a back side insulating layer on a back side of the substrate; and a back side bonding structure on the back side insulating layer. The TSV structure includes a front side end on a front side of the substrate and contacts the internal circuit and a back side end extending toward a back side of the substrate. The back side bonding structure includes a back side bonding interconnection portion on the back side insulating layer defining a back side bonding via hole therein and a back side bonding via plug portion in the back side bonding via hole in the back side insulating layer connected to a back side end of the TSV structure.

In further embodiments, the back side bonding structure may include a back side bonding interconnection layer and a back side bonding barrier layer. The TSV structure may include a TSV core, a TSV barrier layer surrounding the TSV core, and a TSV liner surrounding the TSV barrier layer. The TSV barrier layer may completely surround a side and a back side end of the TSV core, and the TSV liner may entirely surround a side of the TSV barrier layer and partially expose the TSV barrier layer on the back side end of the TSV core. The exposed TSV barrier layer may be in direct contact with the back side bonding barrier layer.

In still further embodiments, the back side bonding interconnection layer and the TSV core may include copper (Cu). The back side bonding barrier layer and the TSV barrier layer may include one of titanium (Ti) and tantalum (Ta). The TSV liner may include silicon oxide.

In some embodiments, the back side bonding barrier layer may surround a lower surface and sides of the back side bonding interconnection portion and a lower surface and sides of the back side bonding via plug portion, and expose an upper surface of the back side bonding interconnection portion.

In further embodiments, the back side insulating layer may include a lower back side insulating layer on the back side of the substrate and configured to define the back side bonding via plug portion; and an upper back side insulating layer on the lower back side insulating layer and configured to define the back side bonding interconnection portion.

In still further embodiments, the substrate and the lower back side insulating layer may define the back side bonding via hole, and the back side bonding via plug portion may be in the back side bonding via hole.

In some embodiments, the semiconductor device may further include an insulating back side bonding via spacer on an inner wall of the back side bonding via hole. The insulating back side bonding via spacer may directly contact the back side bonding barrier layer.

In further embodiments, the upper back side insulating layer and the insulating back side bonding via spacer may include a same material.

In still further embodiments, the back side bonding interconnection portion may include a TSV connection portion, a pad portion, and an interconnection portion connecting the TSV connection portion and the pad portion. The TSV connection portion may be on the back side bonding via plug portion.

In some embodiments, the TSV structure, the back side bonding via plug portion, and the back side bonding interconnection portion may be vertically aligned.

In further embodiments, the device may further include transistors on the front side of the substrate, the transistors including gate electrodes. Contact plugs electrically connecting the substrate and the gate electrodes of the transistors to the internal circuit may be provided. A lower interlayer insulating layer may cover the transistors and an upper interlayer insulating layer may cover the internal circuit. A front side redistribution structure on the upper interlayer insulating layer may also be provided.

In still further embodiments, the internal circuit may include an internal via having a pillar shape, an internal interconnection having a mesa shape, and a TSV pad contacting the front side end of the TSV structure.

In some embodiments, the front side redistribution structure may include a front side redistribution pad and a front side redistribution interconnection at a same level.

Further embodiments of the present inventive concept provide semiconductor devices including an internal circuit on a front side of a substrate, the substrate defining a through-silicon via (TSV) structure extending vertically therein and including a front side end at a first side of the substrate and contacts the internal circuit and a back side end in the substrate extending towards a back side of the substrate; a front side redistribution pad on the internal circuit of the substrate; and a back side insulating layer and a back side bonding structure having a T-shaped longitudinal cross-section on the back side of the substrate. The back side bonding structure includes a back side bonding via plug portion corresponds to a vertical portion of the T-shape cross-section, is defined by the back side insulating layer, and contacts the back side end of the TSV structure. The back side bonding interconnection portion corresponds to a horizontal portion of the T-shape cross-section and extends onto the back side insulating layer.

Still further embodiments of the inventive concept provide semiconductor devices including a semiconductor substrate; and a through-silicon via (TSV) structure defined by the semiconductor substrate, an open end of the TSV structure adjacent a front side of the substrate and a back side of the TSV structure extending into the substrate towards, but not to, a surface of a back side of the substrate such that the back side of the TSV structure is protected from damage due to subsequent processes.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1A:
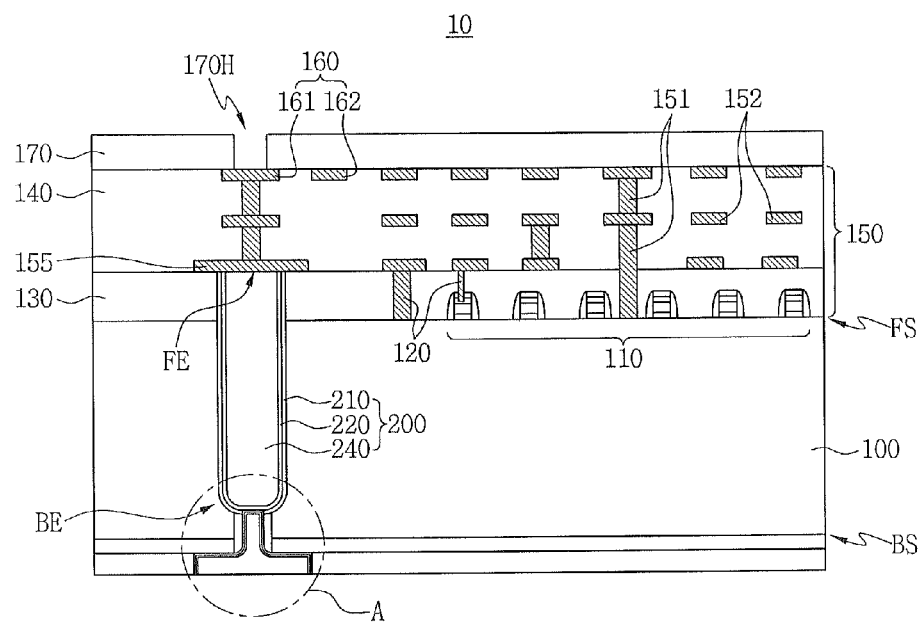
FIG. 1A is a longitudinal cross-section illustrating a semiconductor device according to some embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Although a few embodiments of the inventive concept have been shown and described, it would be appreciated by those of ordinary skill in the art that changes may be made in these exemplary embodiments without departing from the principles and spirit of the inventive concept, the scope of which is defined in the claims and their equivalents.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "top end", "bottom end", "top surface", "bottom surface", "upper", and "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Various example embodiments will now be described more fully with reference to the accompanying drawings in which some example embodiments are shown. In the drawings, the thicknesses of layers and regions may be exaggerated for clarity. As such, variations from the shapes of the illustrations as a result, for example, of manufacturing techniques and/or tolerances, may be expected. Thus, exemplary embodiments should not be construed as limited to the particular shape illustrated herein but may include deviations in shapes that result, for example, from manufacturing. For example, an etched region illustrated at right angle may have a rounded shape or a shape having a predetermined curvature. Thus, the regions illustrated in the figures are schematic in nature and their shapes do not necessarily illustrate the actual shape of a region of a device and do not limit the scope.

Like numbers refer to like elements throughout. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the disclosure, relative terms 'front side' and 'back side' are used as relative concepts to facilitate the understanding of the inventive concept. Therefore, 'front side' and 'back side' do not designate a specific direction, position, or component and may be interchangeable. For example, 'front side' may be interpreted as 'back side' and 'back side' may be interpreted as 'front side'. Therefore, 'front side' may be represented as 'first side' and 'back side' may be represented as 'second side', while 'front side' may be represented as 'second side' and 'back side' may be represented as 'first side'. However, 'front side' and 'back side' are not mixed with each other in one embodiment.

In the disclosure, a term 'near' means that any one of two or more components having symmetric concepts is disposed to be relatively close to another specific component. For example, a phrase 'a first end is near a first surface' may be understood as meaning that the first end is closer to the first surface than a second end or that the first end is closer to the first surface than a second surface.

Figure 1B:
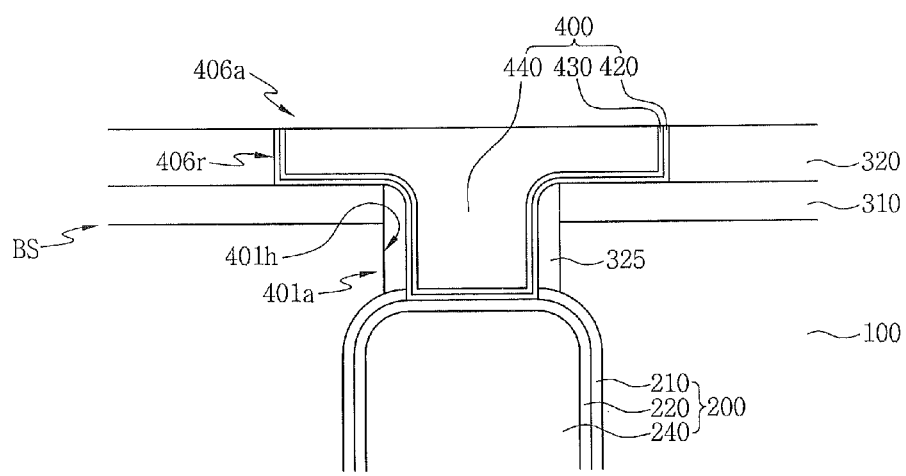
FIG. 1B is a partially enlarged view of the A region of FIG. 1A according to some embodiments of the present inventive concept.

Referring first to FIGS. 1A and 1B, cross-sections of a semiconductor device 10 in accordance with some embodiments of the present inventive concept will be discussed. As illustrated in FIGS. 1A and 1B, the semiconductor device 10 may include transistors 110, contact plugs 120, internal circuits 150, and a front side redistribution structure 160 on a front side FS of a substrate 100. The semiconductor device 10 may further include a through-silicon via (TSV) structure 200 in the substrate 100. The semiconductor device 10 may further include a back side bonding structure 400 on a back side BS of the substrate 100. The semiconductor device 10 may further include a lower interlayer insulating layer 130 covering the transistors 110 and the contact plugs 120, an upper interlayer insulating layer 140 covering the internal circuits 150, and a front side passivation layer 170 covering the front side redistribution structure 160. The semiconductor device 10 may further include a lower back side insulating layer 310 and an upper back side insulating layer 320 formed on the back side BS of the substrate 100.

The substrate 100 may include a silicon wafer. For example, the substrate 100 may include a single crystalline silicon wafer, a silicon bulk wafer including silicon carbide (SiC) or silicon germanium (SiGe), or a silicon-on-insulator (SOI) wafer including an insulating layer. In some embodiments, the substrate 100 may be a single crystalline bulk wafer.

The contact plugs 120 may electrically connect the substrate 100 and/or the transistors 110 to the internal circuits 150. For example, the contact plugs 120 may electrically connect doped regions in the substrate 100 and gate electrodes and/or source and drain electrodes of the transistors 110 to the internal circuits 150. The contact plugs 120 may include a metal such as tungsten (W).

The internal circuits 150 may include internal vias 151, internal interconnections 152, and a TSV pad 155. The internal vias 151 may vertically connect the substrate 100 and the internal interconnections 152 to transfer electrical signals. The internal interconnections 152 may horizontally connect the internal vias 151 to transfer electrical signals. The TSV pad 155 may be disposed on the TSV structure 200. The internal circuits 150 may include a metal such as copper (Cu). Each of the lower interlayer insulating layer 130 and the upper interlayer insulating layer 140 may include silicon oxide.

The front side redistribution structure 160 may be formed to be buried in an upper portion of the upper interlayer insulating layer 140 so that an upper surface of the front side redistribution structure 160 is exposed. The upper surface of the front side redistribution structure 160 and an upper surface of the interlayer insulating layer 140 may be planarized. The front side redistribution structure 160 may include a front side redistribution pad 161 and a front side redistribution interconnection 162 which are at the same level. The front side redistribution pad 161 may be electrically connected to the TSV pad 155 and the TSV structure 200. The front side redistribution structure 160 may include a metal such as copper (Cu).

The front side passivation layer 170 may have a front side redistribution pad hole 170H exposing the front side redistribution pad 161. The front side passivation layer 170 may include silicon nitride, polyimide, or photosensitive polyimide.

The TSV structure 200 may include a front side end FE protruding onto the front side FS of the substrate 100, and a back side end BE positioned in the substrate 100 towards the back side BS of the substrate 100. The TSV structure 200 may include a TSV liner 210, a TSV barrier layer 220, and a TSV core 240.

The TSV core 240 may have a pillar shape, and a side of the TSV core 240 may be surrounded by the TSV barrier layer 220 and the TSV liner 210. For example, the TSV core 240 may include a metal such as copper (Cu).

The TSV barrier layer 220 may include titanium (Ti), titanium nitride (TiN), titanium tungsten (TiW), tantalum (Ta), tantalum nitride (TaN), tungsten nitride (WN), or other refractory metals. The TSV barrier layer 220 may be formed in a structure of a single layer or multiple layers. The TSV liner 210 may include an insulating material such as silicon oxide.

The front side end FE of the TSV structure 200 may be in direct contact with the TSV pad 155. The front side end FE of the TSV structure 200 may have a completely exposed surface of the TSV core 240. The front side end FE of the TSV structure 200 may include the TSV barrier layer 220, surrounding the exposed side of the TSV core 240, and the TSV liner 210 surrounding an outer surface of the TSV barrier layer 220. Therefore, the TSV core 240 may be in direct contact with the TSV pad 155.

The lower back side insulating layer 310 and the upper back side insulating layer 320 may be formed on the back side BS of the substrate 100. The lower back side insulating layer 310 may be in direct contact with the back side BS of the substrate 100. The upper back side insulating layer 320 may be formed on the lower back side insulating layer 310. The lower back side insulating layer 310 may include silicon oxide, and the upper back side insulating layer 320 may include silicon nitride.

The back side bonding structure 400 may include a back side bonding interconnection layer 440 and a back side bonding barrier layer 420 surrounding a lower surface and sides of the back side bonding interconnection layer 440, and exposing an upper surface of the back side bonding interconnection layer 440. A back side bonding seed layer 430 may be between the back side bonding interconnection layer 440 and the back side bonding barrier layer 420. In embodiments where the back side bonding seed layer 430 and the back side bonding interconnection layer 440 include the same material, an interface between the back side bonding seed layer 430 and the back side bonding interconnection layer 440 may be removed. In some embodiments, the interface therebetween is illustrated to indicate that the back side bonding seed layer 430 and the back side bonding interconnection layer 440 may include different materials.

The back side bonding barrier layer 420 may include titanium (Ti), titanium nitride (TiN), titanium tungsten (TiW), tantalum (Ta), tantalum nitride (TaN), tungsten nitride (WN), or other non-reactive metals. The back side bonding interconnection layer 440 may include copper (Cu), nickel (Ni), or a noble metal. The back side bonding seed layer 430 may include copper (Cu).

The back side bonding structure 400 may include a back side bonding via plug portion 401a filling a back side bonding via hole 401h and a back side bonding interconnection portion 406a filling a back side bonding recess 406r. The back side bonding via plug portion 401a may have a smaller horizontal width than the back side bonding interconnection portion 406a. The back side bonding via hole 401h may be defined by the substrate 100 and the lower back side insulating layer 310. The back side bonding recess 406r may be defined by the upper back side insulating layer 320. An upper surface of the back side bonding interconnection portion 406a may be positioned at the same level as that of the upper back side insulating layer 320.

The back side bonding via plug portion 401a may be in contact with a portion of the back side end BE of the TSV structure 200. For example, on the back side end BE of the TSV structure 200, the back side bonding barrier layer 420 may be in direct contact with the TSV barrier layer 220. The back side bonding via plug portion 401a may have a smaller horizontal width than the TSV structure 200. For example, a portion of the back side end BE of the TSV structure 200 may be in contact with the back side bonding via plug portion 401a, and another portion thereof may not be in contact with the back side bonding via plug portion 401a. Furthermore, the portion of the back side end BE of the TSV structure 200 which is in contact with the back side bonding via plug portion 401a may be surrounded by the other portion of the back side end BE of the TSV structure 200 which is not contact with the back side bond via plug portion 401a. In some embodiments, since the back side bonding via plug portion 401a has the smaller horizontal width than the TSV structure 200, the substrate 100 may not be exposed in a bottom of the back side bonding via hole 401h even when misalignment occurs in the process of forming the back side bonding via hole 401h and the like. When the substrate 100 is exposed in the bottom of the back side bonding via hole 401h, the back side bonding structure 400 and the substrate 100 may be electrically short-circuited.

The back side bonding via plug portion 401a may be surrounded by a back side bonding via spacer 325. For example, the back side bonding barrier layer 420 of the back side bonding via plug portion 401a may be in direct contact with the back side bonding via spacer 325. In the back side bonding via plug portion 401a, a portion of sides of the back side bonding barrier layer 420 may be in contact with the TSV liner 210. Further, the back side bonding via plug portion 401a may penetrate the lower back side insulating layer 310 and the substrate 100 to be in contact with the TSV structure 200. The back side bonding via spacer 325 may be interposed between the back side bonding via plug portion 401a and the lower back side insulating layer 310, and between the back side bonding via plug portion 401a and the substrate 100. The back side bonding via spacer 325 may be disposed on a side of the TSV liner 210. The back side bonding via spacer 325 may include silicon nitride.

Figure 1C:
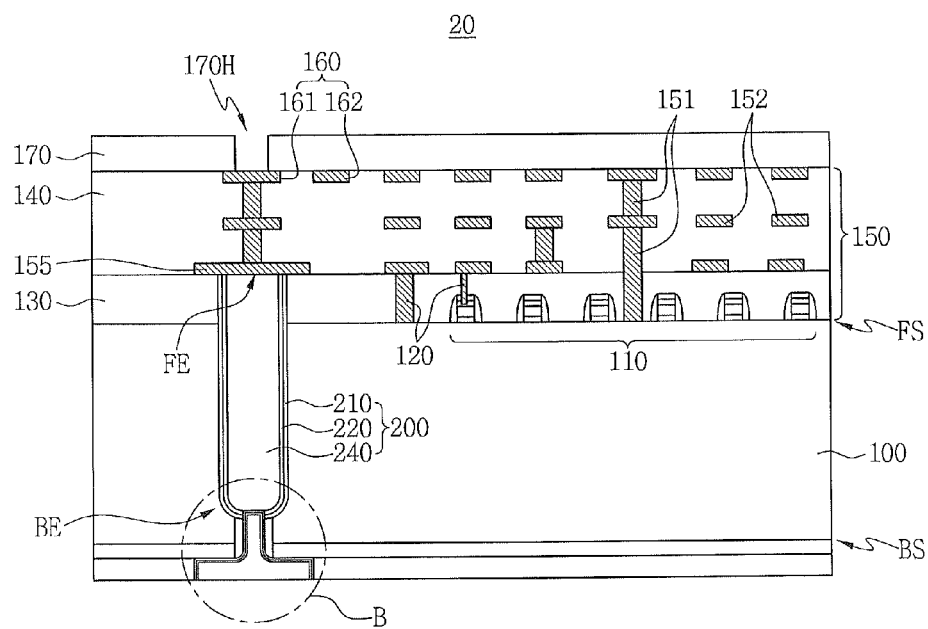
FIG. 1C is a longitudinal cross-section illustrating a semiconductor device according to some embodiments of the inventive concept.
Figure 1D:
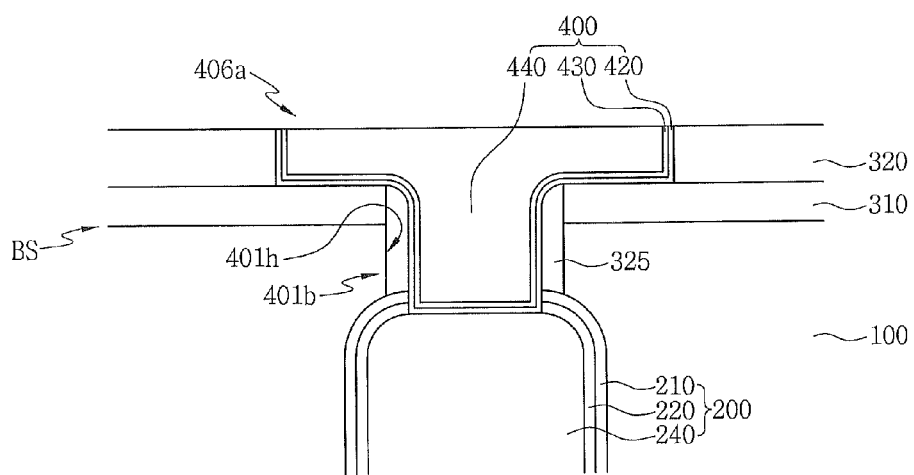
FIG. 1D is a partially enlarged view of the B region of FIG. 1C according to some embodiments of the present inventive concept.

Referring now to FIGS. 1C and 1D, a longitudinal cross-section illustrating a semiconductor device 20 according to some embodiments of the inventive concept and an enlarged view of a region B of FIG. 1C, respectively, will be discussed. As illustrated in FIGS. 1C and 1D, the semiconductor device 20 according to some embodiments of the inventive concept may include a back side bonding structure 400 having a back side bonding via plug portion 401b in which a back side bonding barrier layer 420 is in direct contact with a TSV core 240. For example, a portion of a lower portion of sides of the back side bonding barrier layer 420 in the back side bonding via plug portion 401b may be in contact with the TSV barrier layer 220.

Figure 1E:
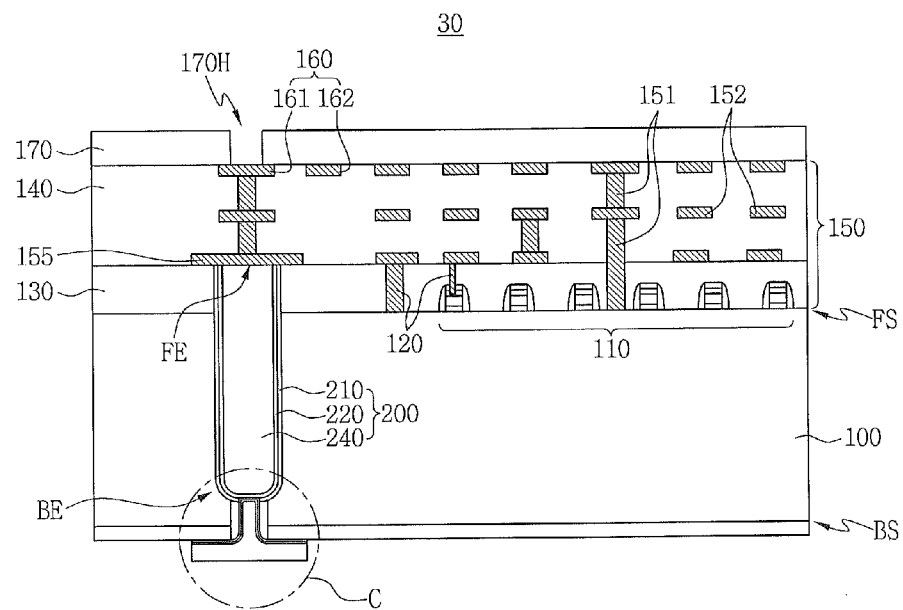
FIG. 1E is a longitudinal cross-section illustrating a semiconductor device according to some embodiments of the present inventive concept.
Figure 1F:
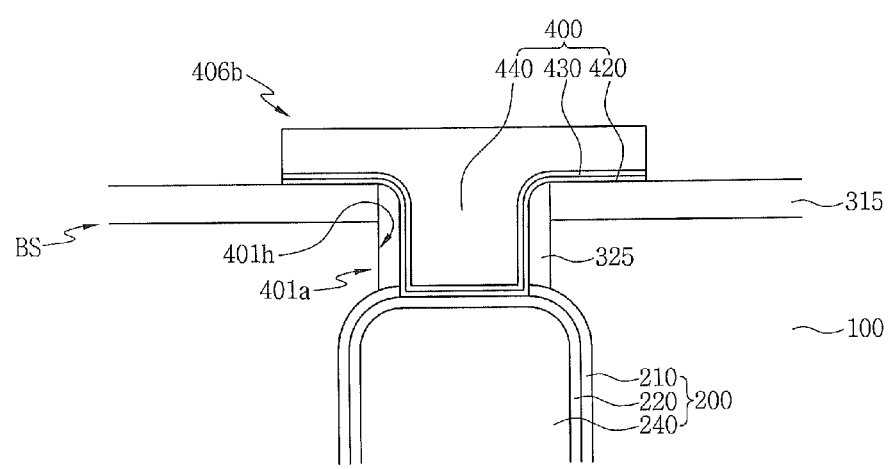
FIG. 1F is a partially enlarged view of the C region of FIG. 1E according to some embodiments of the present inventive concept.

Referring now to FIGS. 1E and 1F, a longitudinal cross-section illustrating a semiconductor device 30 according to some embodiments of the inventive concept and an enlarged view of a region C of FIG. 1F, respectively, will be discussed. As illustrated in FIGS. 1E and 1F, the semiconductor device 30 according to some embodiments of the inventive concept may include transistors 110, contact plugs 120, internal circuits 150, and a front side redistribution structure 160 formed on a front side FS of a substrate 100, a TSV structure 200 formed in the substrate 100, and a back side bonding structure 400 protruding on a back side BS of the substrate 100. The semiconductor device 30 may further include a lower interlayer insulating layer 130 covering or surrounding the transistors 110 and the contact plugs 120, an upper interlayer insulating layer 140 covering or surrounding the internal circuits 150, and a front side passivation layer 170 covering the front side redistribution structure 160. The semiconductor device 30 may further include a back side insulating layer 315 on the back side BS of the substrate 100.

The back side insulating layer 315 may be formed on the back side BS of the substrate 100. The back side insulating layer 315 may be in direct contact with the back side BS of the substrate 100. The back side insulating layer 315 may include silicon oxide.

The back side bonding structure 400 may include a back side bonding interconnection layer 440 and a back side bonding barrier layer 420. The back side bonding barrier layer 420 may surround a buried lower surface and a buried portion of sides of the back side bonding interconnection layer 440 and expose a protruding portion of the side and a protruding upper surface of the back side bonding interconnection layer 440. A back side bonding seed layer 430 may be formed between the back side bonding interconnection layer 440 and the back side bonding barrier layer 420. When the back side bonding seed layer 430 and the back side bonding interconnection layer 440 include the same material, an interface between the back side bonding seed layer 430 and the back side bonding interconnection layer 440 may be removed.

The back side bonding structure 400 may include a back side bonding via plug portion 401a filling a back side bonding via hole 401h and a back side bonding interconnection portion 406b protruding onto the back side insulating layer 315. The back side bonding via hole 401h may be defined by the substrate 100 and the back side insulating layer 315. The back side bonding barrier layer 420 may surround a lower surface and sides of the back side bonding via plug portion 401a and a lower surface of back side bonding interconnection portion 406b. A side and an upper surface of the back side bonding interconnection portion 406b may not be covered with the back side bonding barrier layer 420.

The back side bonding via plug portion 401a may be in contact with a portion of the back side end BE of the TSV structure 200. For example, the back side bonding barrier layer 420 may be in direct contact with the TSV barrier layer 220. The sides of the back side bonding via plug portion 401a may be surrounded by a back side bonding via spacer 325. For example, the back side bonding barrier layer 420 of the back side bonding via plug portion 401a may be in direct contact with the back side bonding via spacer 325. In the back side bonding via plug portion 401a, a portion of the sides of the back side bonding barrier layer 420 may be in contact with the TSV liner 210. The back side bonding via spacer 325 may be disposed on the TSV liner 210.

Figure 1G:
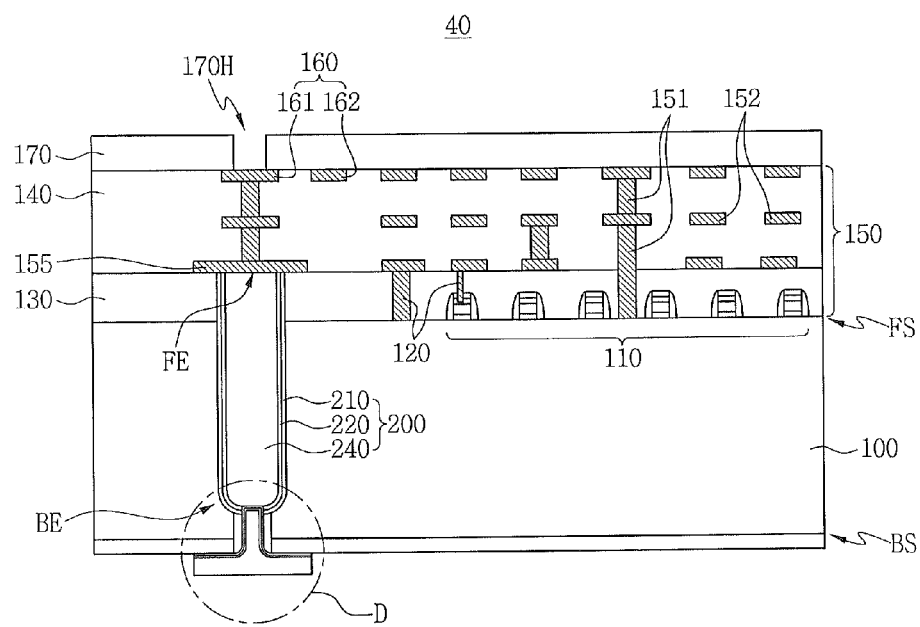
FIG. 1G is a longitudinal cross-section illustrating a semiconductor device according some embodiments of the present inventive concept.
Figure 1H:
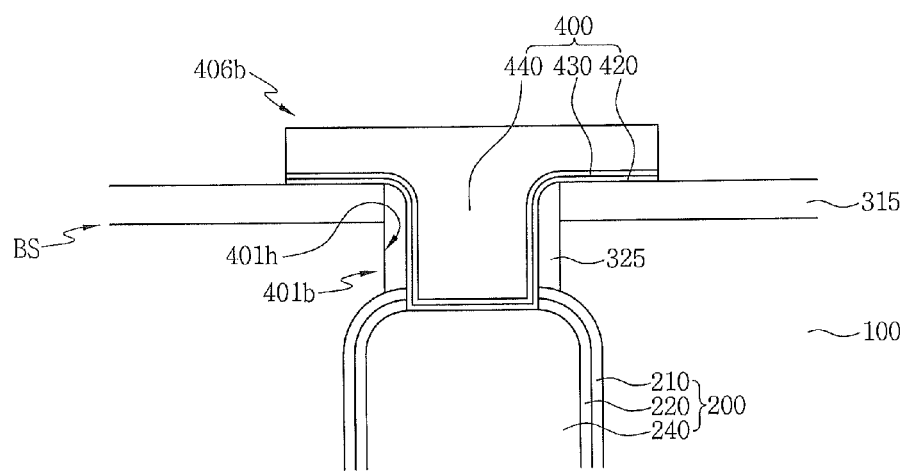
FIG. 1H is a partially enlarged view of the D region of FIG. 1G according to some embodiments of the present inventive concept.

Referring now to FIGS. 1G and 1H, a longitudinal cross-section illustrating a semiconductor device 40 according to some embodiments of the inventive concept and an enlarged view of a region D of FIG. 1G, respectively, will be discussed. As illustrated in FIGS. 1G and 1H, the semiconductor device 40 according to some embodiments of the inventive concept may include a back side bonding structure 400 having a back side bonding via plug portion 410b in which a back side bonding barrier layer 420 is in direct contact with a TSV core 240. The back side bonding structure 400 may protrude onto a back side BS of the substrate 100. For example, a portion of a lower portion of sides of the back side bonding barrier layer 420 in the back side bonding via plug portion 401b may be in contact with the TSV barrier layer 220.

The semiconductor devices 10, 20, 30, and 40 according to some embodiments of the inventive concept may include the TSV structure 200 having the recessed back side end BE lower than the back side BS of the substrate 100. Therefore, the back side end BE of the TSV structure 200 may be protected from an etch process, a removing process, a grinding process, a polishing process, or a planarization process which physically or chemically attacks the back side BS of the substrate 100. When the back side end BE of the TSV structure 200 is physically or chemically attacked, adhesion force between the TSV structure 200 and the substrate 100, or between the TSV structure 200 the back side insulating layers 310, 315, and 320, is degraded so that subsequent processes are difficult to be performed, and yield, performance, and life cycle may be degraded.

Figure 2A:
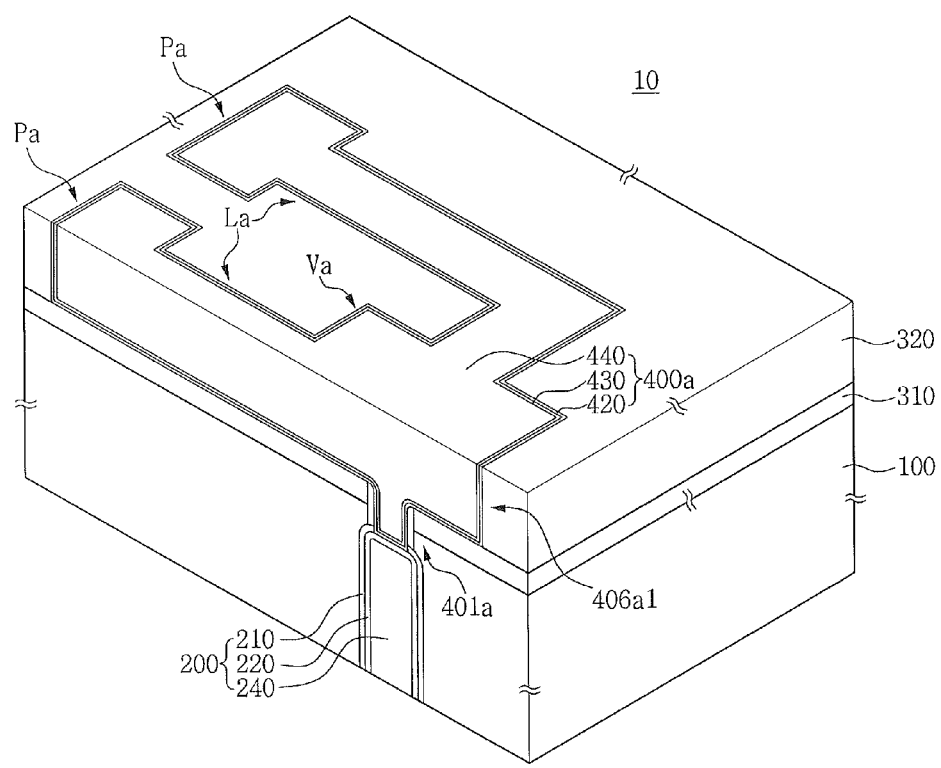
FIGS. 2A through 2H are perspective views schematically illustrating semiconductor devices according to some embodiments of the inventive concept.

Referring now to FIGS. 2A to 2H, perspective views schematically illustrating semiconductor devices 10, 20, 30, 40, 50, 60, 70, and 80 according some embodiments of the inventive concept will be discussed. As illustrated in FIG. 2A, the semiconductor device 10 according to some embodiments of the inventive concept may include a TSV structure 200 penetrating a substrate 100, a lower back side insulating layer 310 and an upper back side insulating layer 320 formed on the substrate 100, and a back side bonding structure 400a buried in the lower back side insulating layer 310 and the upper back side insulating layer 320 and in contact with the TSV structure 200.

The back side bonding structure 400a may include a back side bonding via plug portion 401a and a back side bonding interconnection portion 406a1. The back side bonding via plug portion 401a may be defined by the substrate 100 and the lower back side insulating layer 310, and may be in direct contact with a portion of an upper portion or back side end BS of the TSV structure 200.

The back side bonding interconnection portion 406a1 may be defined by the upper back side insulating layer 320. The back side bonding interconnection portion 406a1 may include a TSV connection portion Va, a horizontal line portion La, and a pad portion Pa. The TSV connection portion Va may be vertically aligned with the TSV structure 200. The horizontal line portion La may be electrically and physically connected to the TSV connection portion Va and horizontally extend. The pad portion Pa may be electrically and physically connected to the horizontal line portion La, and may be electrically connected to input/output (I/O) pads and bumps of the other semiconductor devices.

Figure 2B:
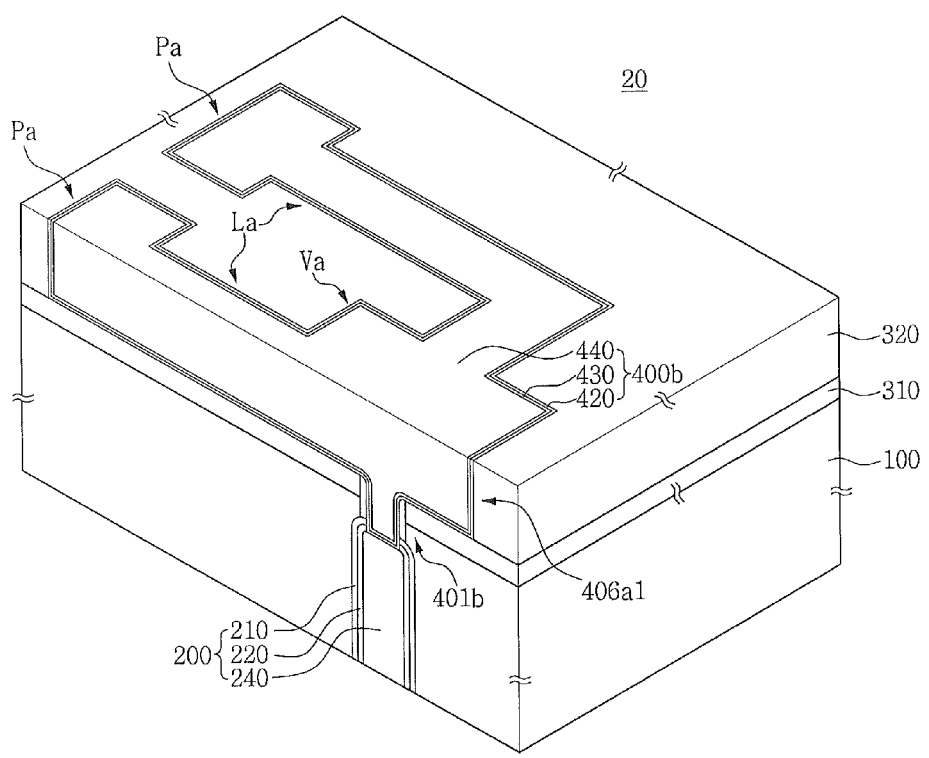

Referring now to FIG. 2B, a back side bonding structure 400b of the semiconductor device 20 according to some embodiments of the inventive concept may include a back side bonding via plug portion 401b, and the back side bonding via plug portion 401b may include a back side bonding barrier layer 420 which further penetrates a TSV barrier layer 220 and is in direct contact with a TSV core 240.

Figure 2C:
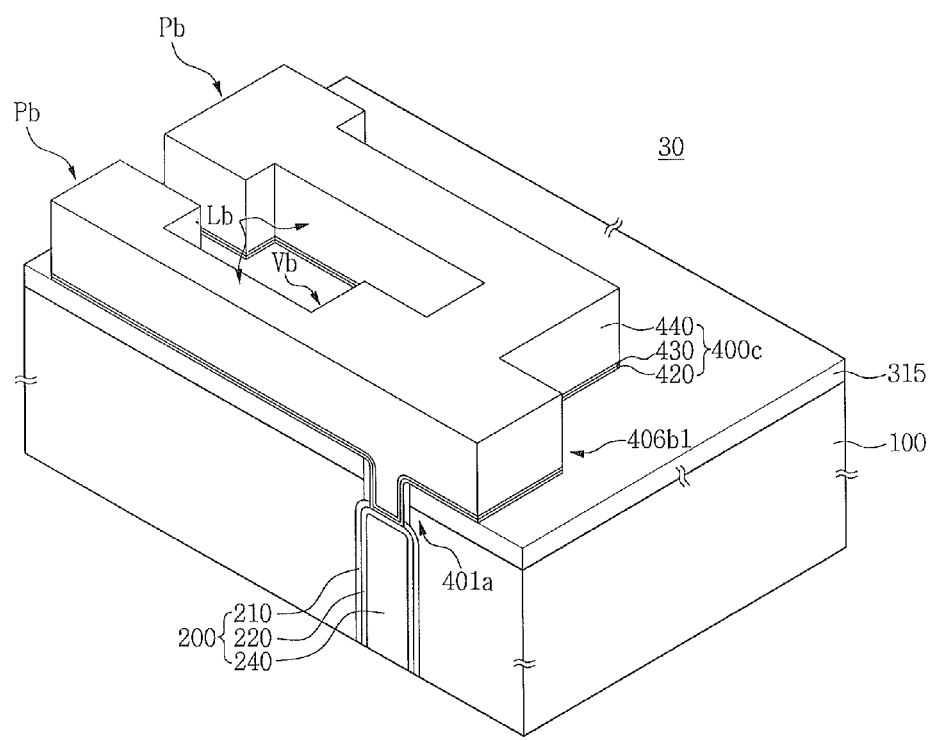

Referring to FIG. 2C, the semiconductor device 30 according to some embodiments of the inventive concept may include a TSV structure 200 penetrating a substrate 100, a back side insulating layer 315 formed on the substrate 100, and a back side bonding structure 400c which penetrates the back side insulating layer 315 and is in contact with the TSV structure 200. The back side bonding structure 400c may include a back side bonding via plug portion 401a surrounded by the substrate 100 and the back side insulating layer 315, and a back side bonding interconnection portion 406b1 protruding more than a surface of the back side insulating layer 315. The back side bonding interconnection portion 406b1 may include a TSV connection portion Vb, a horizontal line portion Lb, and a pad portion Pb.

Figure 2D:
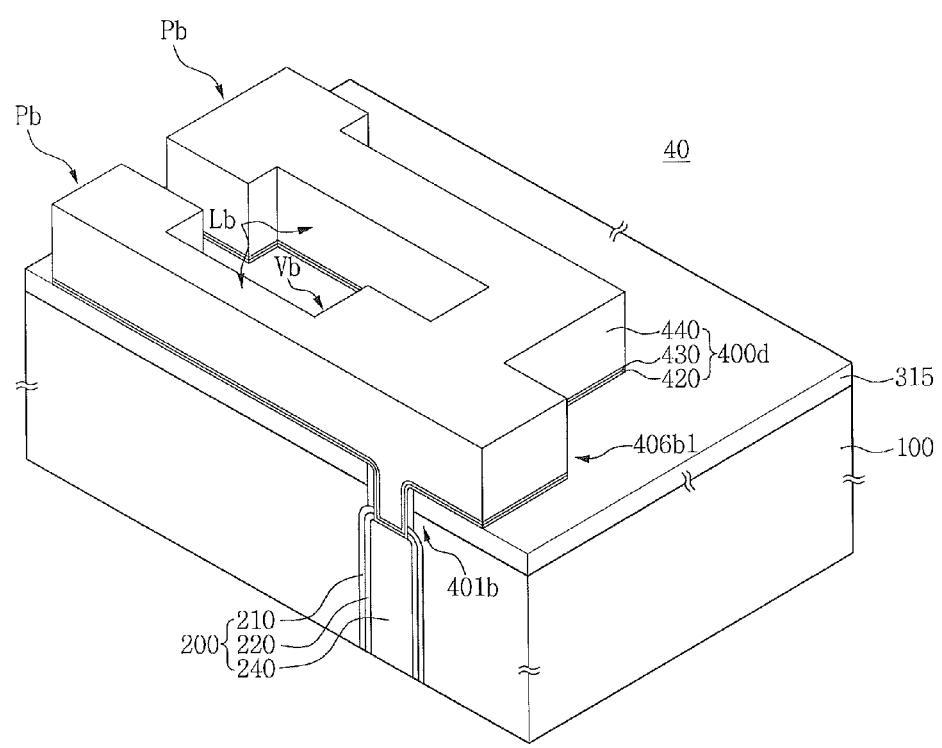

Referring now to FIG. 2D, a back side bonding structure 400d of the semiconductor device 40 according to some embodiments of the inventive concept may include a back side bonding via plug portion 401b surrounded by a substrate 100 and a back side insulating layer 315, and a back side bonding interconnection portion 406b1 protruding more than a surface of the back side insulating layer 315. The back side bonding via plug portion 401b may include a back side bonding barrier layer 420 which further penetrates a TSV barrier layer 220 and is in direct contact with a TSV core 240. interconnection For example, the back side bonding structures 400a to 400d according to various embodiments of the inventive concept illustrated in FIGS. 2A to 2D, respectively, may include back side redistribution structures having the TSV connection portions Va and Vb, the horizontal line portions La and Lb, and the pad portions Pa and Pb, respectively.

Figure 2E:
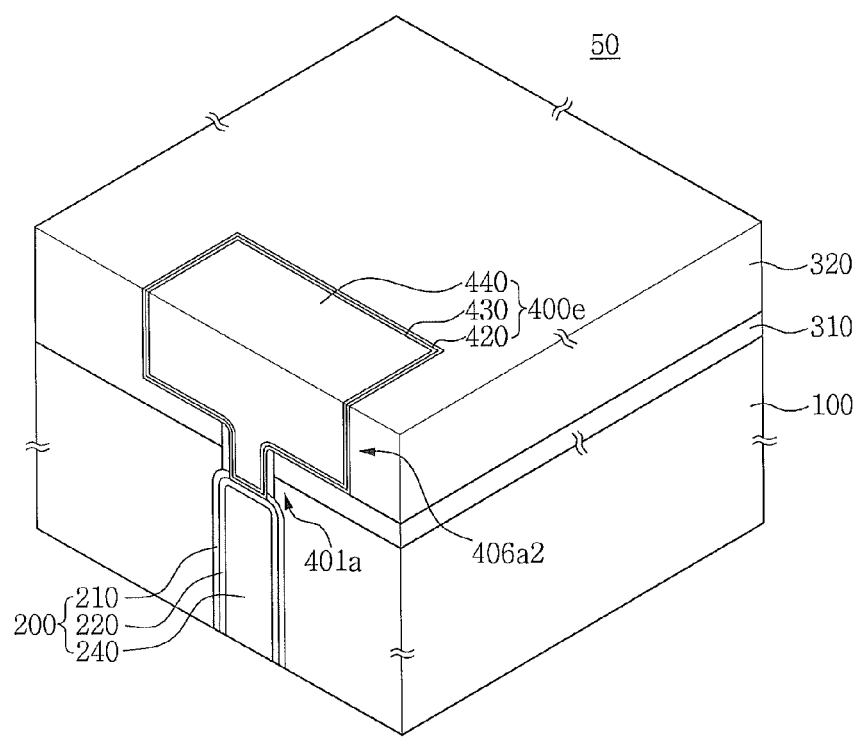

Referring now to FIG. 2E, the semiconductor device 50 according to some embodiments of the inventive concept may include a TSV structure 200 penetrating a substrate 100, a lower back side insulating layer 310 and an upper back side insulating layer 320 formed on the substrate 100, and a back side bonding structure 400e buried in the lower back side insulating layer 310 and the upper back side insulating layer 320 and in contact with the TSV structure 200. The back side bonding structure 400e may include a back side bonding via plug portion 401a and a back side bonding interconnection portion 406a2. The back side bonding interconnection portion 406a2 may include a bump pad. For example, the back side bonding interconnection portion 406a2 may be used as a bump pad to be electrically connected to the other semiconductor devices. In further embodiments, for example, the back side bonding interconnection portion 406a2 may have both functions of the TSV connection portion Va and the pad portion Pa of FIG. 2A.

Figure 2F:
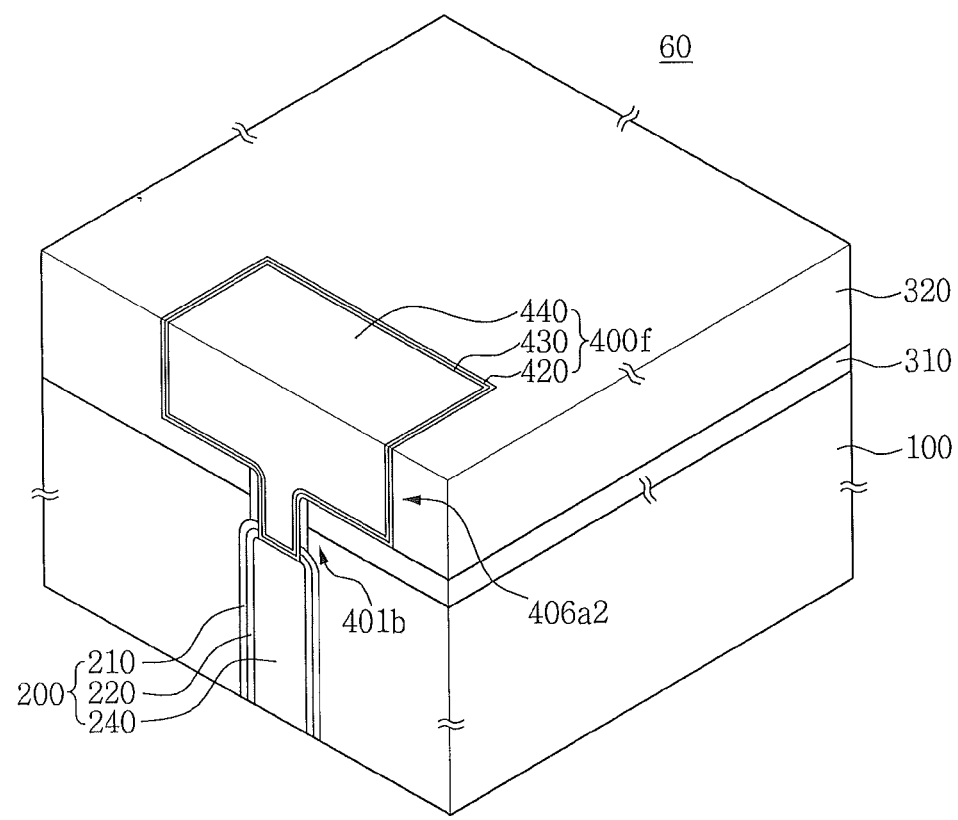

Referring now to FIG. 2F, a back side bonding structure 400f of the semiconductor device 60 according to some embodiments of the inventive concept may include a back side bonding via plug portion 401b, and the back side bonding via plug portion 401b may include a back side bonding barrier layer 420 which further penetrates a TSV barrier layer 220 and is in direct contact with a TSV core 240.

Figure 2G:
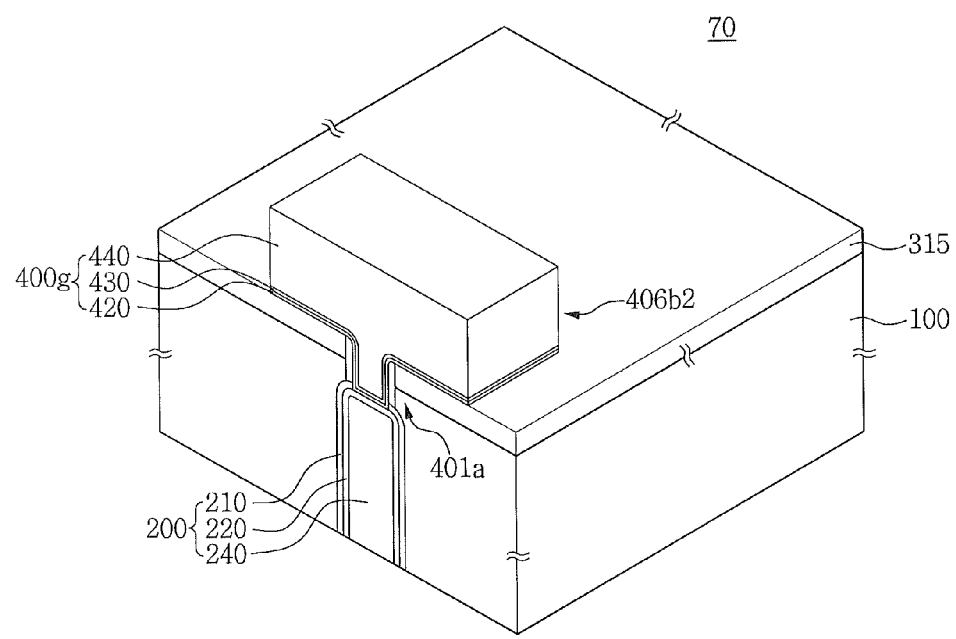

Referring now to FIG. 2G, the semiconductor device 70 according to some embodiments of the inventive concept may include a TSV structure 200 penetrating a substrate 100, a back side insulating layer 315 formed on the substrate 100, and a back side bonding structure 400g penetrating the back side insulating layer 315 and in contact with the TSV structure 200. The back side bonding structure 400g may include a back side bonding via plug portion 401a surrounded by the substrate 100 and the back side insulating layer 315, and a back side bonding interconnection portion 406b2 protruding more than a surface of the back side insulating layer 315. For example, the back side bonding interconnection portion 406b2 may have both functions of the TSV connection portion Vb and the pad portion Pb of FIG. 2C.

Figure 2H:
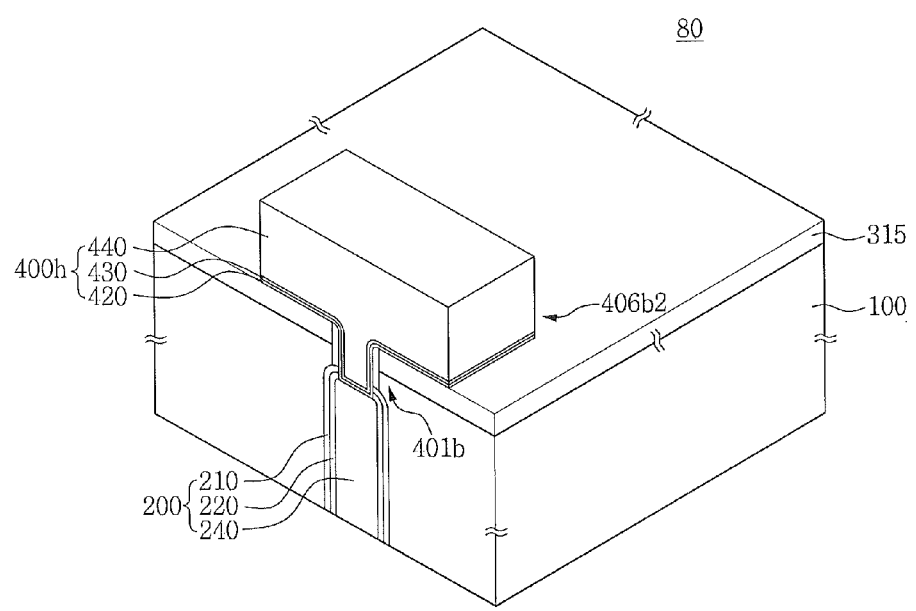

Referring now to FIG. 2H, a back side bonding structure 400h of the semiconductor device 80 according to some embodiments of the inventive concept may include a back side bonding via plug portion 401b, and the back side bonding via plug portion 401b may include a back side bonding barrier layer 420 which further penetrates a TSV barrier layer 220 and is in direct contact with a TSV core 240. The back side bonding structure 400h may include a back side bonding via plug portion 401b surrounded by a substrate 100 and a back side insulating layer 315, and a back side bonding interconnection portion 406b2 protruding more than a surface of the back side insulating layer 315.

For example, the back side bonding structures 400e to 400h according to various embodiments of the inventive concept illustrated in FIGS. 2E to 2H, respectively, may include back side bump pad structures having functions of the TSV connection portions Va and Vb and the pad portions Pa and Pb illustrated in FIGS. 2A through 2D.

Figure 3A:
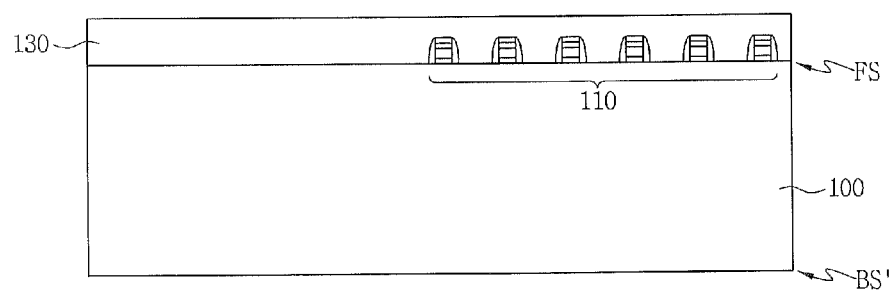
FIGS. 3A to 3Q, 4A to 4C, 5A to 5I, and 6A to 6E are longitudinal cross-sections illustrating processing steps in the fabrication of semiconductors devices according to various embodiments of the inventive concept.
Figure 3B:
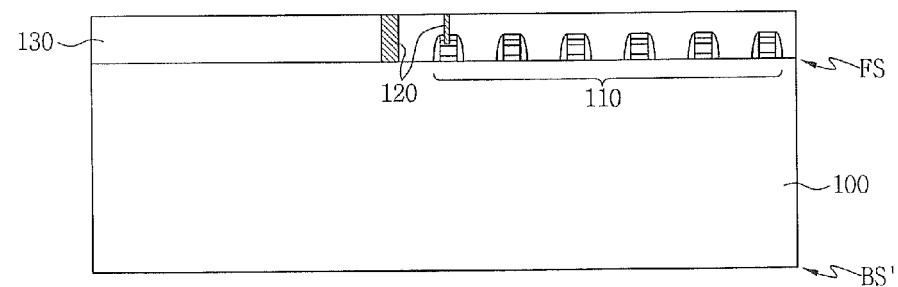
Figure 3C:
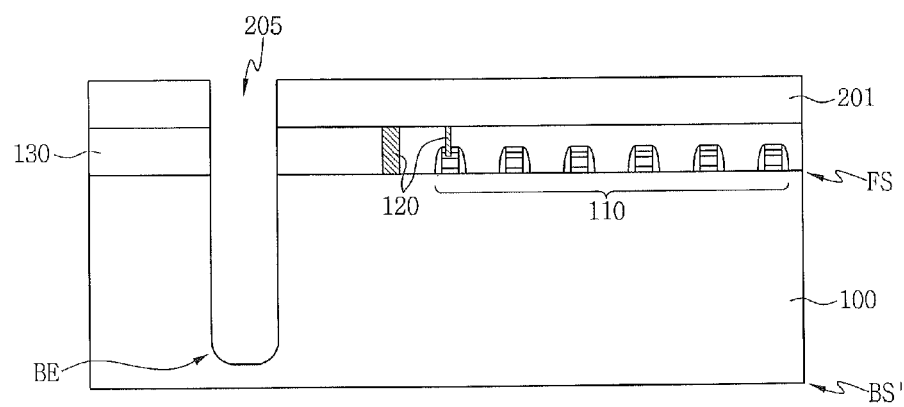
Figure 3D:
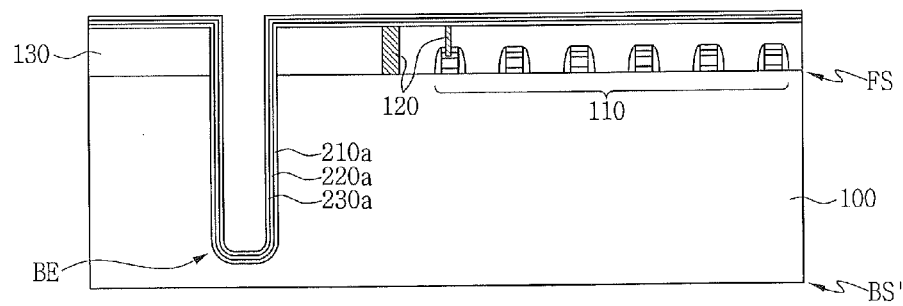
Figure 3E:
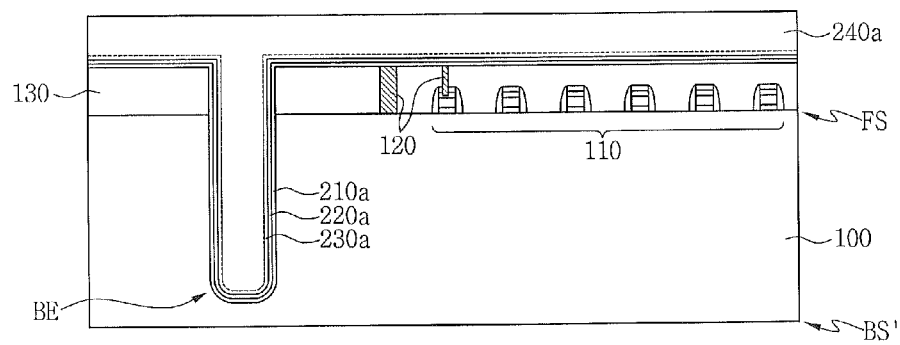
Figure 3F:
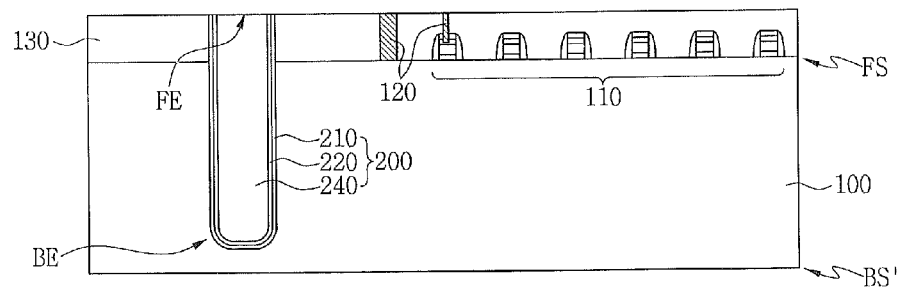
Figure 3G:
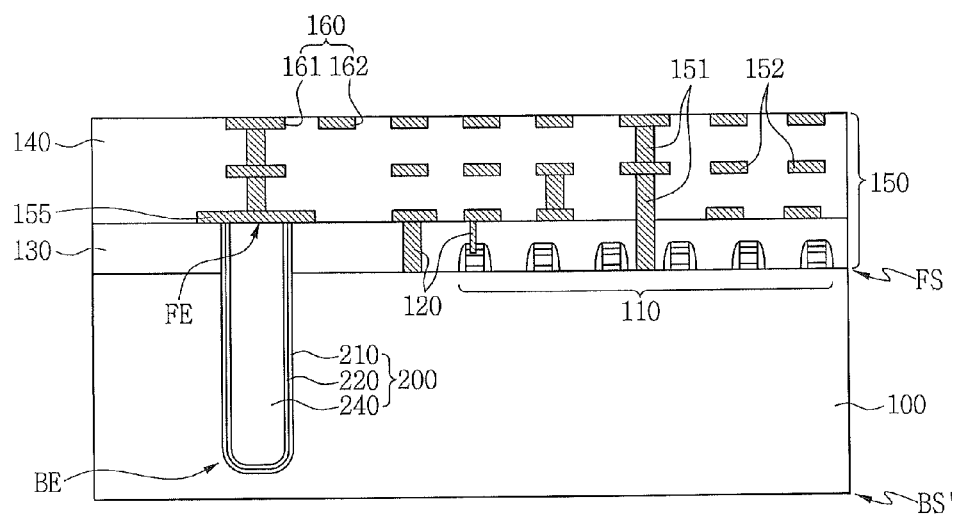
Figure 3H:
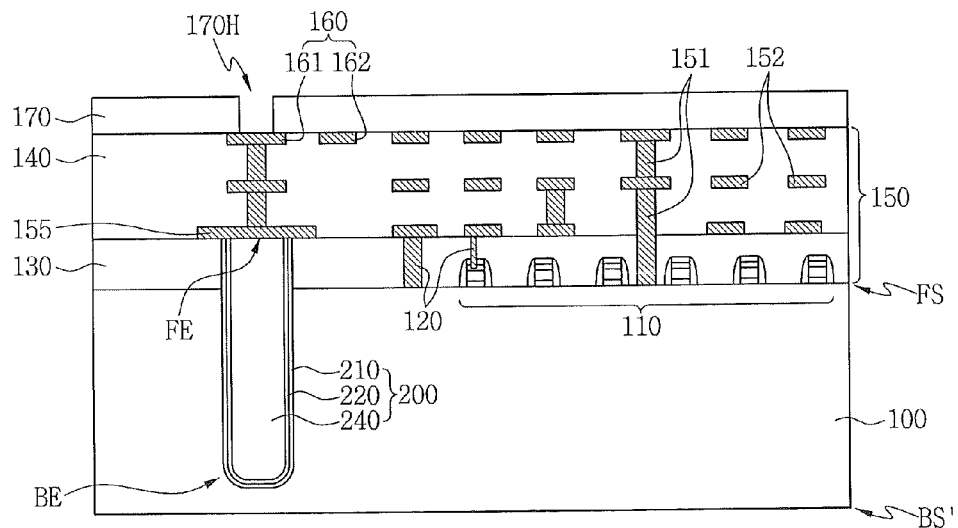
Figure 3I:
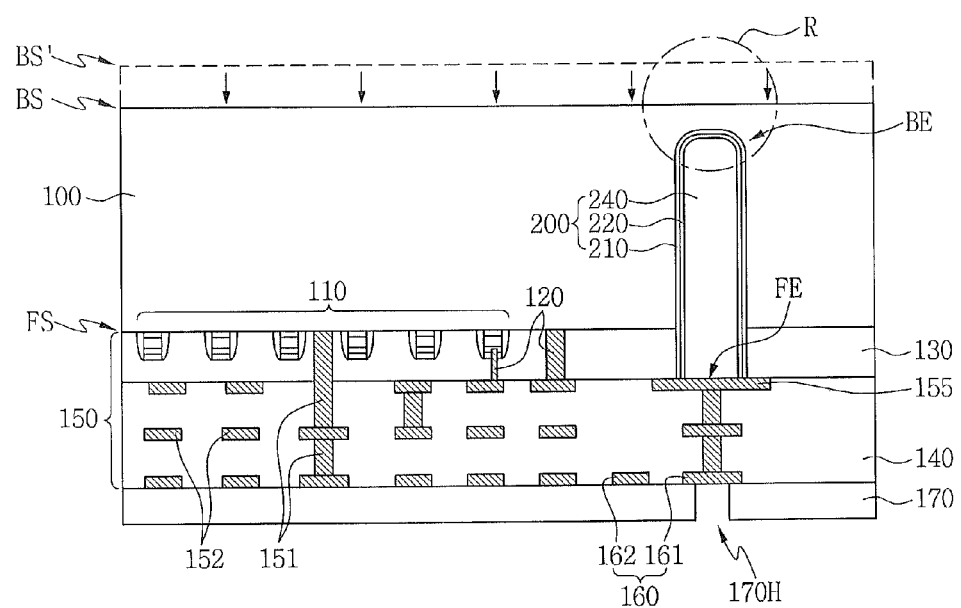
Figure 3J:
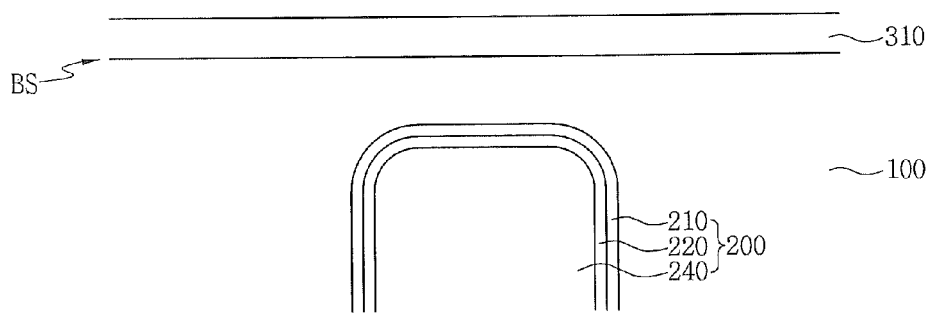
Figure 3K:
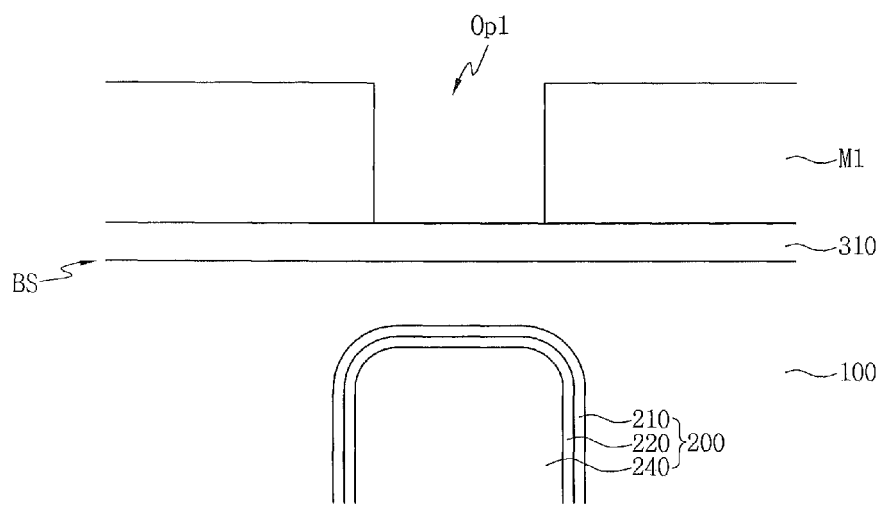
Figure 3L:
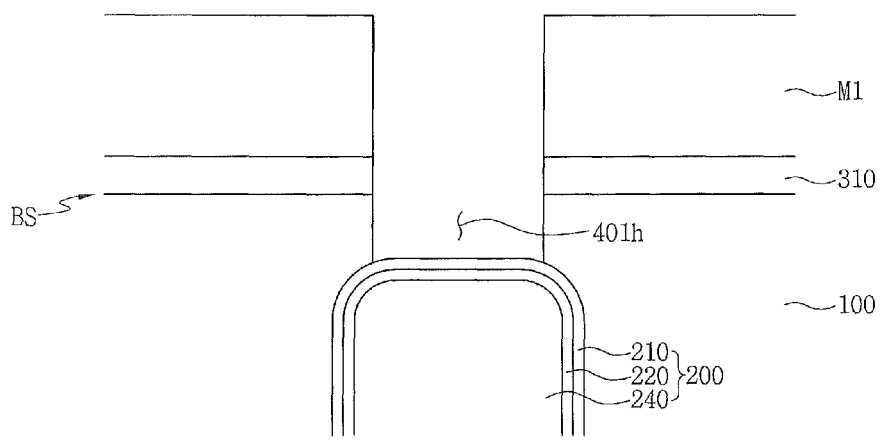
Figure 3M:
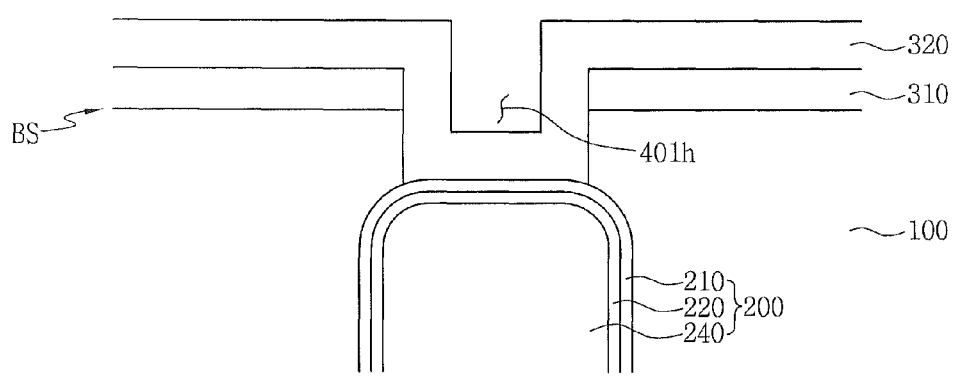
Figure 3N:
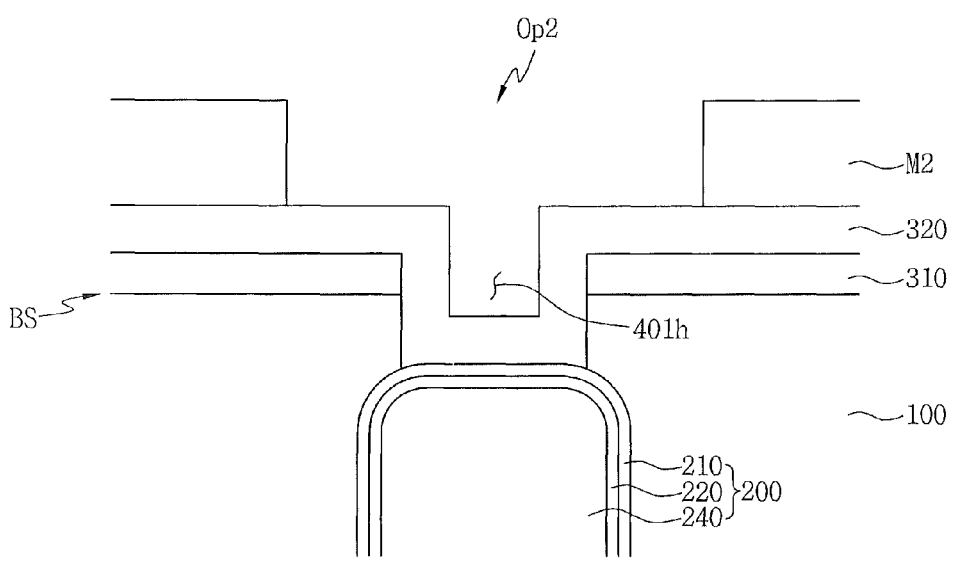
Figure 3O:
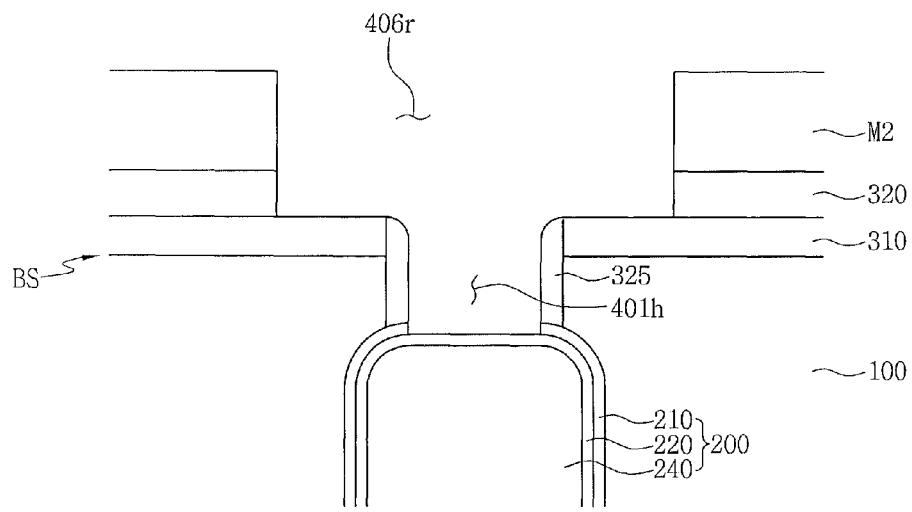
Figure 3P:
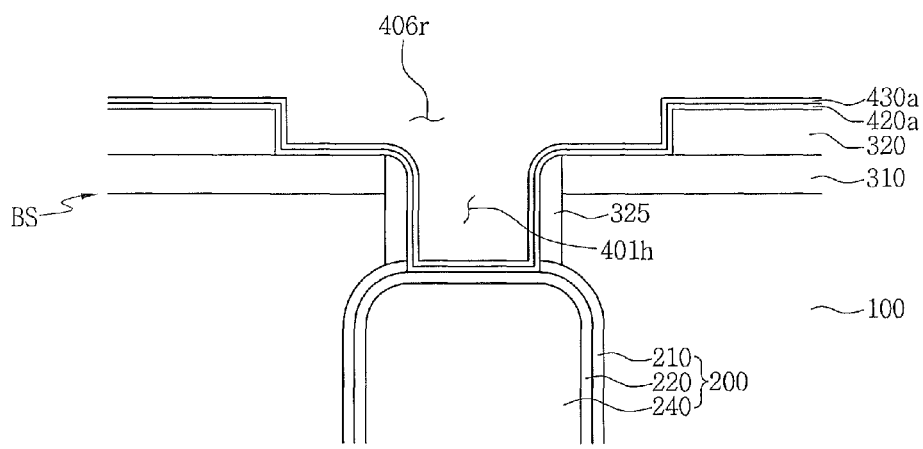
Figure 3Q:
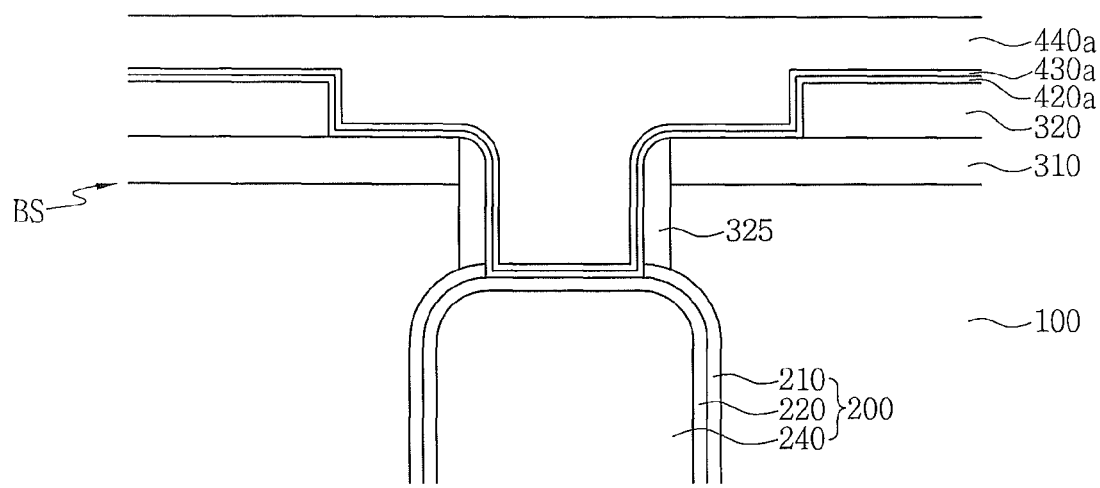

Referring now to FIGS. 3A to 3Q, longitudinal cross-sections illustrating processing steps in the fabrication of semiconductor devices according to some embodiments of the inventive concept will be discussed. Referring first to FIG. 3A, methods of fabricating semiconductor devices according to some embodiments may include forming transistors 110 on a front side FS of a substrate 100. Subsequently a lower interlayer insulating layer 130 covering the transistors 110 on the front side FS of the substrate 100 may be formed. The lower interlayer insulating layer 130 may include, for example, silicon oxide.

Referring now to FIG. 3B, contact plugs 120 may be formed. The contact plugs 120 may vertically penetrate the lower interlayer insulating layer 130 to be in contact with the substrate 100 and/or the transistors 110. The contact plugs 120 may include a metal such as tungsten (W).

Referring now to FIG. 3C, a TSV hole 205 may be formed in the substrate 100. The forming of the TSV hole 205 may include forming a TSV hole mask pattern 201 on the lower interlayer insulating layer 130, and etching the substrate 100 using the TSV hole mask pattern 201 as an etch mask to provide the hole 205 defined by the substrate 100. The TSV hole mask pattern 201 may include, for example, silicon nitride, silicon oxynitride, or an organic material such as photoresist without departing from the scope of the present inventive concept. The lowermost end BE of the TSV hole 205 may be positioned in an inside of the substrate 100, for example, a bulk. The TSV hole mask pattern 201 may be removed after the TSV hole 205 is formed.

Referring now to FIG. 3D, a TSV liner 210, a TSV barrier layer 220, and a TSV seed layer 230 may be formed conformally on an inner wall of the TSV hole 205. The TSV liner 210 may include, for example, silicon oxide or silicon nitride. In some embodiments, the TSV liner 210 may be deposited using an atomic layer deposition (ALD) process, a plasma-enhanced chemical vapor deposition (PECVD) process, or a sub-atmosphere chemical vapor deposition (SACVD) process. In further embodiments, the TSV liner 210 may be formed by oxidizing the inner wall of the TSV hole 205 using a thermal oxidation process, and the like. The forming of the TSV barrier layer 220 may include conformally forming a barrier metal on the TSV liner 210 using a physical vapor deposition (PVD) process such as sputtering, or a metal organic chemical vapor deposition (MOCVD) process. The TSV barrier layer 220 may include titanium (Ti), titanium nitride (TiN), titanium tungsten (TiW), tantalum (Ta), tantalum nitride (TaN), tungsten nitride (WN), or other non-reactive metals. The TSV barrier layer 220 may be formed in a single layer or multiple layers. The forming of the TSV seed layer 230 may include conformally forming a seed metal such as copper (Cu), ruthenium (Ru), nickel (Ni), or tungsten (W), on the TSV barrier layer 220 using a PVD process.

Referring now to FIG. 3E, a TSV core material layer 240a filling an inside of the TSV hole 205 may be formed. The TSV core material layer 240a may be formed using, for example, a plating process. In embodiments where, the TSV seed layer 230 and the TSV core material layer 240a include the same material, an interface between the TSV seed layer 230 and the TSV core material layer 240a may be removed. For example, when both the TSV seed layer 230 and the TSV core material layer 240a include copper (Cu), the interface between the TSV seed layer 230 and the TSV core material layer 240a may be removed. Therefore, the interface between the TSV seed layer 230 and the TSV core material layer 240a is indicated by a dotted line in FIG. 3E. The interface between the TSV seed layer 230 and the TSV core material layer 240a may be omitted from the subsequent drawings.

Referring now to FIG. 3F, a TSV structure 200 may be formed. Forming the TSV structure 200 may include smoothly removing the TSV core material layer 240a, the TSV seed layer 230, the TSV barrier layer 220, and the TSV liner 210 on an upper surface of the lower interlayer insulating layer 130 using, for example, a chemical mechanical polishing (CMP) process. For example, the removing may include removing the TSV core material layer 240a and the TSV seed layer 230 using a first CMP process, removing the TSV barrier layer 220 using a second CMP process, and removing the TSV liner 210 using a wet etch process or a cleaning process. In further embodiments, the removing may include removing the TSV core material layer 240a and the TSV seed layer 230 using a CMP process, and removing the TSV barrier layer 220 and/or the TSV liner 210 using a wet etching process or a cleaning process. Therefore, the TSV structure 200 may include a TSV core 240, the TSV barrier layer 220, and the TSV liner 210.

Referring now to FIG. 3G, internal circuits 150, an upper interlayer insulating layer 140 surrounding the internal circuits 150, and a front side redistribution structure 160 may be formed on the front side of the substrate 100. Forming the internal circuits 150 may include forming a TSV pad 155, conductive vias 151, and conductive internal interconnections 152. The internal vias 151 are illustrated in as vertically extending pillar shapes, and the TSV pad 155 and internal interconnections 152 are illustrated in as horizontally extending mesa shapes. The internal circuits 150 may include a metal such as copper (Cu). The upper interlayer insulating layer 140 may be formed in multiple layers. In the Figures, the upper interlayer insulating layer 140 is illustrated as a single layer. The front side redistribution structure 160 may include a front side redistribution pad 161 and a front side redistribution interconnection 162. The front side redistribution structure 160 may have the same upper surface level as the upper interlayer insulating layer 140. The front side redistribution structure 160 may include a metal such as copper (Cu).

Referring now to FIG. 3H, a front side passivation layer 170 may be formed on the upper interlayer insulating layer 140 and the front side redistribution structure 160. The front side passivation layer 170 may have a front side redistribution pad hole 170H exposing the front side redistribution pad 161.

Referring now to FIG. 3I, a back side BS' of the substrate 100 may be partially removed so that the back side BS' becomes a back side BS. For example, partially removing may include thinning the substrate 100 by performing, for example, a grinding process or an etch-back process. Hereinafter, an R region which is a back side end BE of the TSV structure 200 will be enlarged and illustrated.

Referring now to FIG. 3J, a lower back side insulating layer 310 may be formed directly on the back side BS of the substrate 100 using, for example, a CVD process and the like. For example, the lower back side insulating layer 310 may include silicon oxide.

Referring now to FIG. 3K, a first mask pattern M1 may be formed having a first opening Op1 vertically aligned with the TSV structure 200 on the lower back side insulating layer 310. The first mask pattern M1 may include photoresist.

Referring now to FIG. 3L, the lower back side insulating layer 310 and a portion of the substrate 100 may be etched using the first mask pattern M1 using an etch mask. In the etching process, a back side bonding via hole 401*h* exposing a portion of the back side end BE of the TSV structure 200 may be formed in the substrate 100. Hereafter, the first mask pattern M1 may be removed.

Referring now to FIG. 3M, an upper back side insulating layer 320 may be formed on the back side BS of the substrate 100. The upper back side insulating layer 320 may be conformally formed on an upper surface of the lower back side insulating layer 310, an inner wall of the back side bonding via hole 401*h*, and an exposed portion of the TSV structure 200. The upper back side insulating layer 320 may include silicon oxide or silicon nitride.

Referring now to FIG. 3N, a second mask pattern M2 may be formed having a second opening Op2 exposing the back side bonding via hole 401*h* on the upper back side insulating layer 320. The second mask pattern M2 may include photoresist.

Referring now to FIG. 3O, a back side bonding recess 406*r* and a back side bonding via hole 401*h* exposing the TSV barrier layer 220 may be formed by removing the upper back side insulating layer 320, the lower back side insulating layer 310, and the TSV liner 210. The upper back side insulating layer 320 may remain on inner walls of the back side bonding via hole 401*h* to be transformed into a back side bonding via spacer 325. The second mask pattern M2 may be removed.

Referring now to FIG. 3P, a back side bonding barrier material layer 420*a* and a back side bonding seed material layer 430*a* may be formed in the back side bonding via hole 401*h* and the back side bonding recess 406*r*. The back side bonding barrier material layer 420*a* and the back side bonding seed material layer 430*a* may be conformally formed on an upper surface and a side of the upper back side insulating layer 320, an exposed upper surface of the lower back side insulating layer 310, an upper surface and sides of the back side bonding via spacer 325, and an exposed side of the TSV liner 210 and an upper surface of the TSV barrier layer 220 of the TSV structure 200. The back side bonding barrier material layer 420*a* may be in direct contact with the TSV barrier layer 220. Forming the back side bonding barrier material layer 420*a* may include conformally forming titanium (Ti), titanium nitride (TiN), titanium tungsten (TiW), tantalum (Ta), tantalum nitride (TaN), tungsten nitride (WN), or other nonreactive metals using a PVD process. Forming the back side bonding seed material layer 430*a* may include conformally forming a seed metal such as copper (Cu), ruthenium (Ru), nickel (Ni), or tungsten (W), on the back side bonding barrier material layer 420*a* using a PVD process.

Referring now to FIG. 3Q, a back side bonding interconnection material layer 440*a* may be formed using, for example, a plating method. The back side bonding interconnection material layer 440*a* may include copper (Cu).

Subsequently, referring back to FIG. 1B, the back side bonding structure 400 having the back side bonding interconnection layer 440, the back side bonding seed layer 430, and the back side bonding barrier layer 420 may be formed by removing the back side bonding interconnection material layer 440*a*, the back side bonding seed material layer 430*a*, and the back side bonding barrier material layer 420*a* on the upper back side insulating layer 320 using, for example, a CMP process. The back side bonding interconnection layer 440 may include the back side bonding via plug portion 401*a* and the back side bonding interconnection portion 406*a*.

Figure 4A:
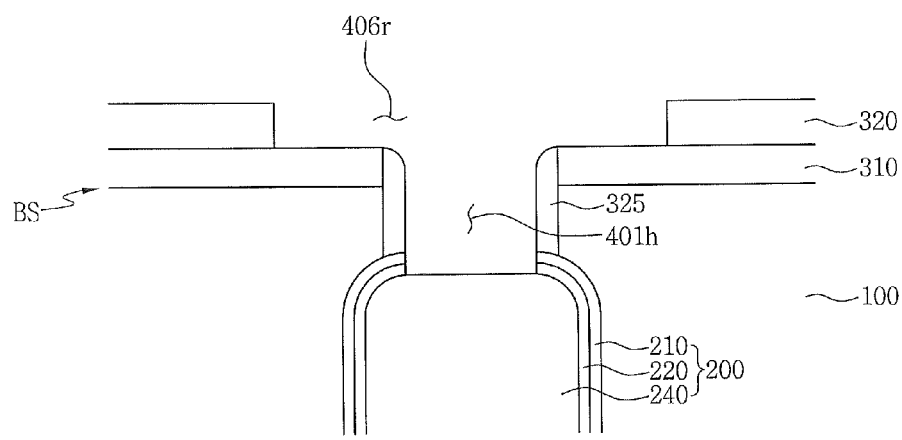
Figure 4B:
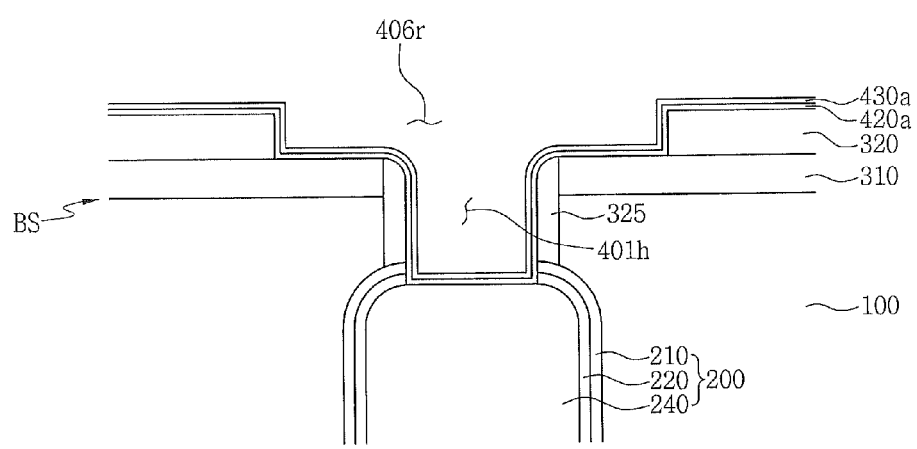
Figure 4C:
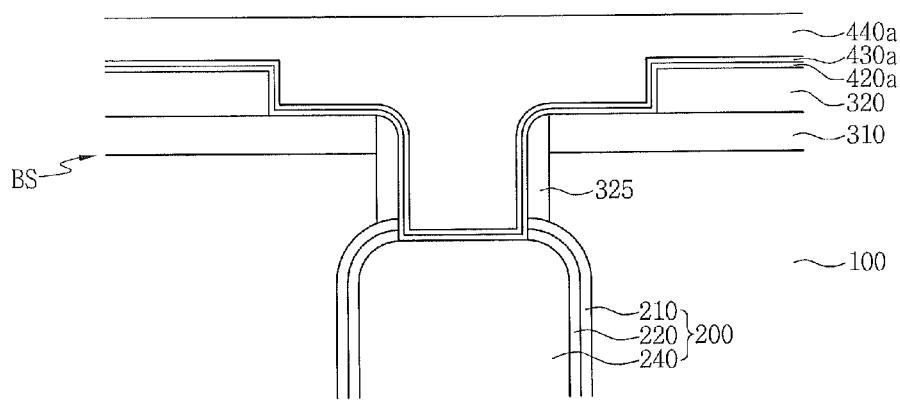

Referring now to FIG. 4A to 4C, longitudinal cross-sections illustrating processing steps in the fabrication of semiconductor devices according to some embodiments of the inventive concept will be discussed. As illustrated in FIG. 4A, a back side bonding recess 406*r* and a back side bonding via hole 401*h* exposing a TSV core 240 may be formed by partially removing a TSV barrier layer 220 after the processes discussed above with respect to FIGS. 3A to 3O are performed. Removing the TSV barrier layer 220 may include performing a wet etch process using a chemical solution containing a hydrogen peroxide solution, calcium hydroxide (KOH), and water. The upper back side insulating layer 320 may remain on inner walls of the back side bonding via hole 401*h* to provide a back side bonding via spacer 325.

Referring now to FIG. 4B, a back side bonding barrier material layer 420*a* and a back side bonding seed material layer 430*a* may be performed in the back side bonding via hole 401*h* and the back side bonding recess 406*r*. The back side bonding barrier material layer 420*a* and a back side bonding seed material layer 430*a* may be conformally formed on an upper surface and a side of the upper back side insulating layer 320, an upper surface of the lower back side insulating layer 310, an upper surface and sides of the back side bonding via spacer 325, and an exposed side of the TSV liner 210, a side surface of the TSV barrier layer 220, and an upper surface of the TSV core 240 of the TSV structure 200.

Referring now to FIG. 4C, a back side bonding interconnection material layer 440*a* may be formed. Subsequently, referring back to FIG. 1D, the back side bonding structure 400 having the back side bonding interconnection layer 440, the back side bonding seed layer 430, and the back side bonding barrier layer 420 may be formed by removing the back side bonding interconnection material layer 440*a*, the back side bonding seed material layer 430*a*, and the back side bonding barrier material layer 420*a* on the upper back side insulating layer 320 using, for example, a CMP process.

Figure 5A:
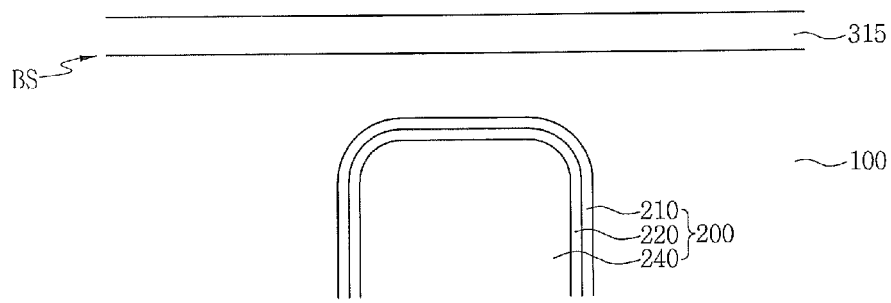

Referring now to FIGS. 5A to 5E, longitudinal cross-sections illustrating processing steps in the fabrication of semiconductor devices according to some embodiments of the inventive concept will be discussed. As illustrated in FIG. 5A, a back side insulating layer 315 may be formed directly on a back side BS of a substrate 100 using, for example, a CVD process, after the processes discussed above with respect to FIGS. 3A to 3I are performed. For example, the back side insulating layer 315 may include silicon oxide.

Figure 5B:
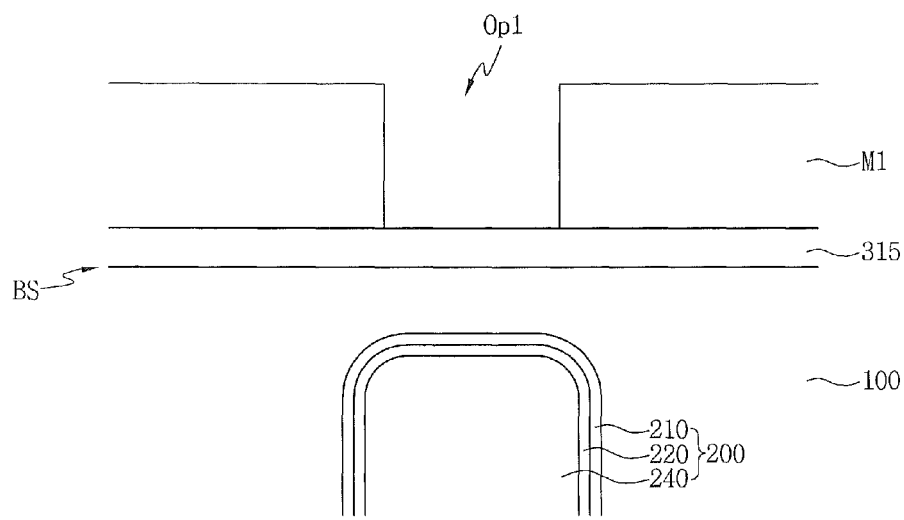

Referring now to FIG. 5B, a first mask pattern M1 may be formed having a first opening Op1, which is vertically aligned with a TSV structure 200, on the back side insulating layer 315. The first mask pattern M1 may include photoresist.

Figure 5C:
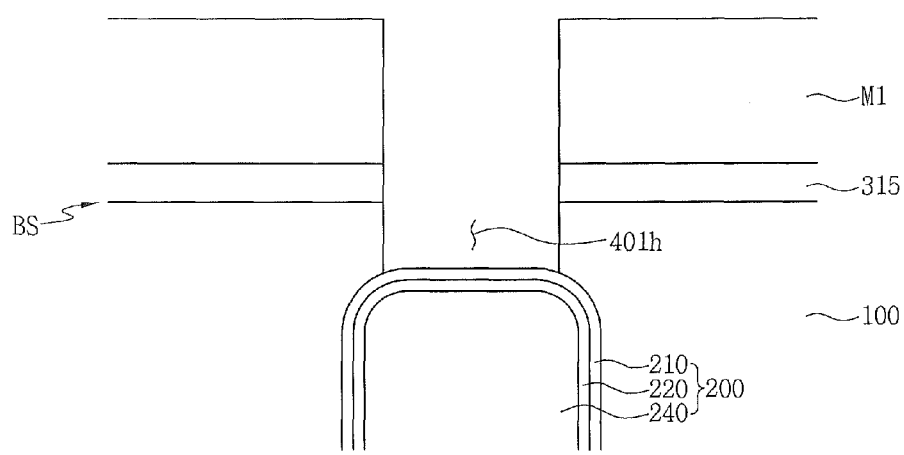

Referring now to FIG. 5C, the back side insulating layer 315 and a portion of the substrate 100 may be etched using the first mask pattern M1 as an etch mask. During the etching process, a back side bonding via hole 401*h* exposing a portion of a back side end BE of the TSV structure 200 may be formed in the substrate 100. Hereafter, the first mask pattern M1 may be removed.

Figure 5D:
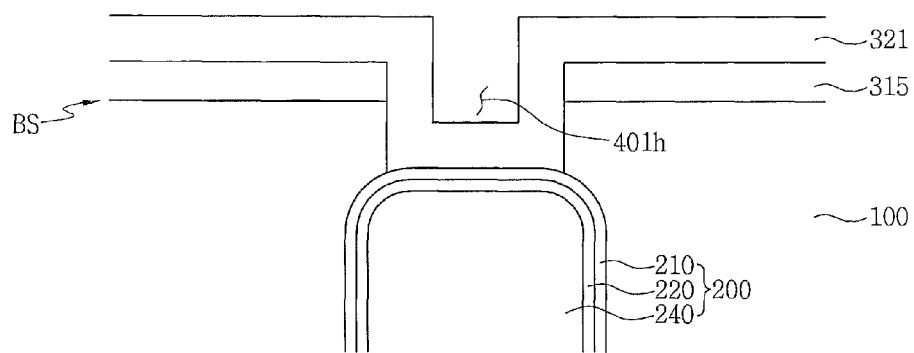

Referring now to FIG. 5D, a spacer insulating layer 321 may be formed on the back side BS of the substrate 100. The spacer insulating layer 321 may be conformally formed on an upper surface of the back side insulating layer 315, an inner wall of the back side bonding via hole 401h, and an exposed portion of the TSV structure 200. The spacer insulating layer 321 may include silicon nitride or silicon oxide.

Figure 5E:
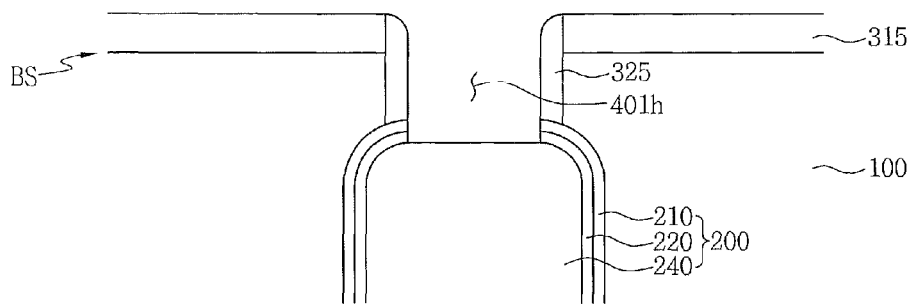

Referring now to FIG. 5E, a back side bonding via hole 401h may be formed exposing the TSV structure 200 by performing an etch back process which partially removes the spacer insulating layer 321. During the etching process, an upper surface of the back side insulating layer 315 may be exposed. The spacer insulating layer 321 may remain on an inner wall of the back side bonding via hole 401h to be transformed into a back side bonding via spacer 325.

Figure 5F:
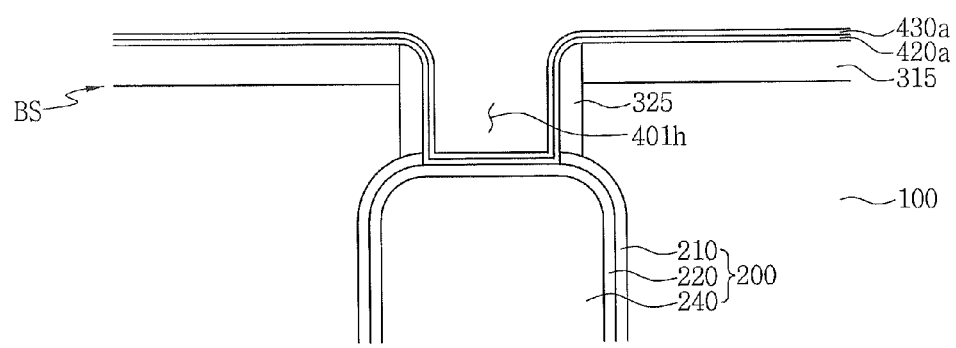

Referring now to FIG. 5F, a back side bonding barrier material layer 420a and a back side bonding seed material layer 430a may be formed in the back side bonding via hole 401h and on the back side insulating layer 315. The back side bonding barrier material layer 420a and the back side bonding seed material layer 430a may be conformally formed on an upper surface of the back side insulating layer 315, an upper surface and sides of the back side bonding via spacer 325, and an exposed portion of the TSV barrier layer 220 of the TSV structure 200.

Figure 5G:
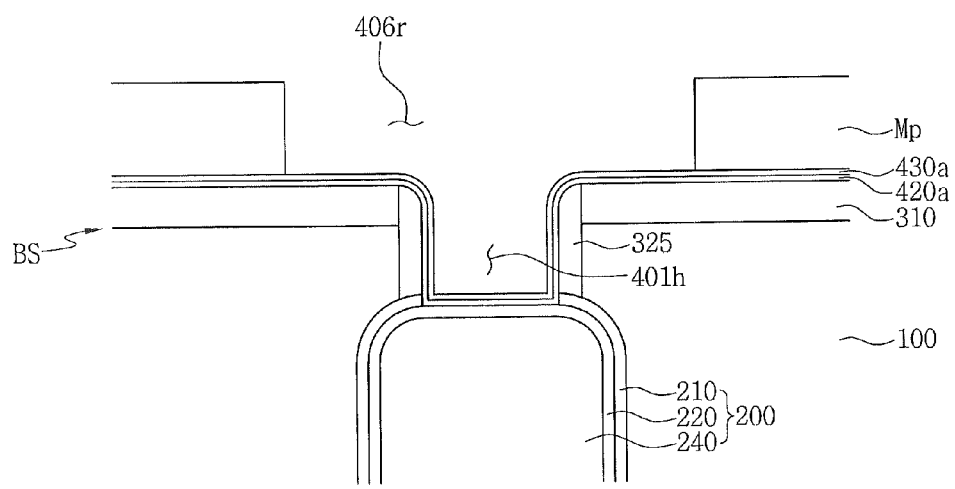

Referring now to FIG. 5G, a plating mask pattern Mp may be formed having a back side bonding recess 406r exposing the back side bonding via hole 401h. The plating mask pattern Mp may include photoresist.

Figure 5H:
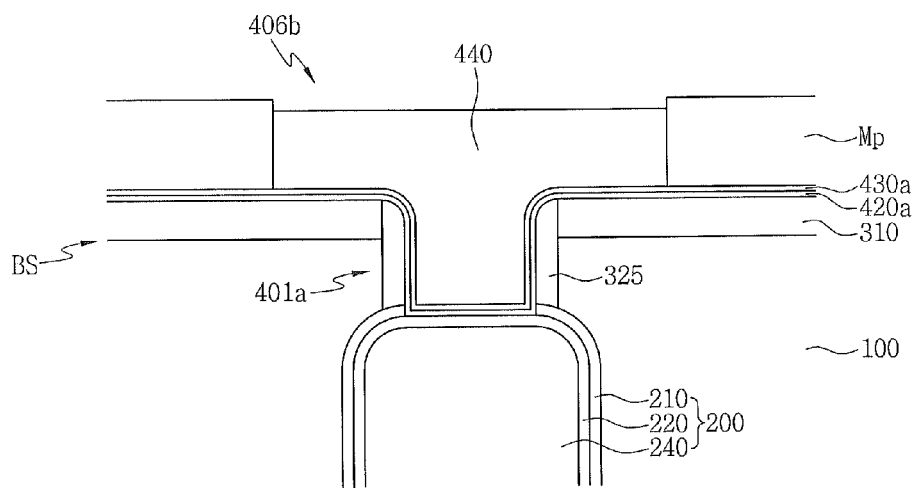

Referring now to FIG. 5H, a back side bonding interconnection layer 440 may be formed using, for example, a plating method. The back side bonding interconnection layer 440 may include a back side bonding via plug portion 401b filling the back side bonding via hole 401h, and a back side bonding interconnection portion 406b filling the back side bonding recess 406r.

Figure 5I:
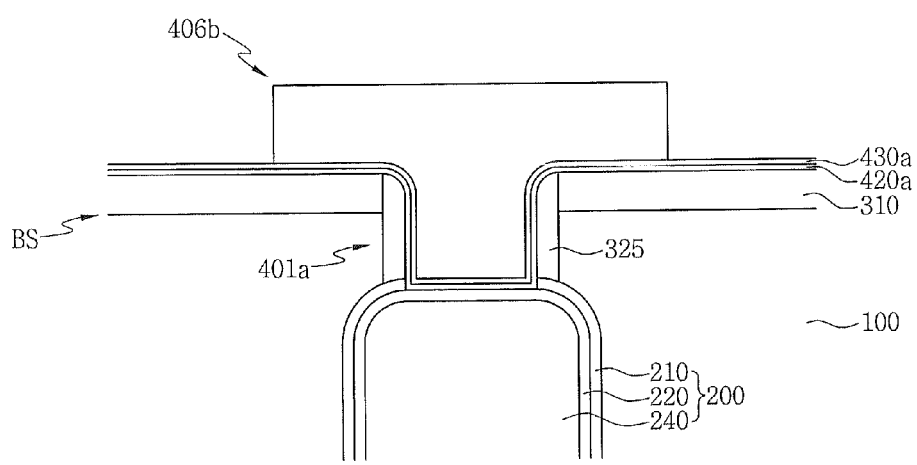

Referring now to FIG. 5I, the plating mask pattern Mp may be removed. During the removing process, the back side bonding seed material layer 430a on the back side insulating layer 315 may be exposed. Subsequently, referring back to FIG. 1F, the back side bonding seed material layer 430a and the back side bonding barrier material layer 420a may be removed from the back side insulating layer 315.

Figure 6A:
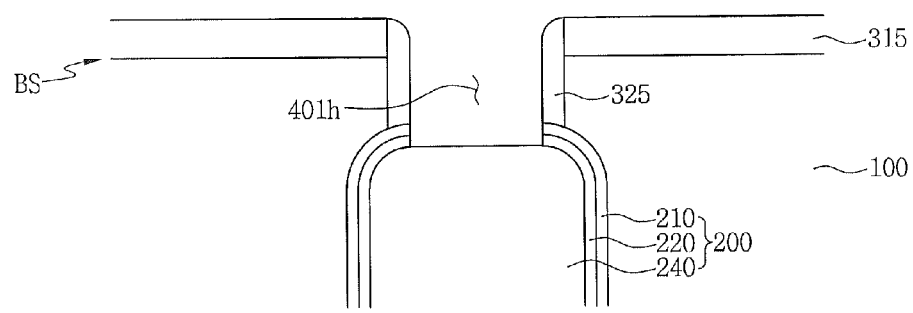

Referring now to FIGS. 6A to 6E, longitudinal cross-sections illustrating processing steps in the fabrication of semiconductor devices according to some embodiments of the inventive concept will be discussed. As illustrated in FIG. 6A, a TSV core 240 may be exposed by removing a TSV barrier layer 220 after the processes discussed above with respect to FIGS. 3A to 3I and 5A to 5E are performed.

Figure 6B:
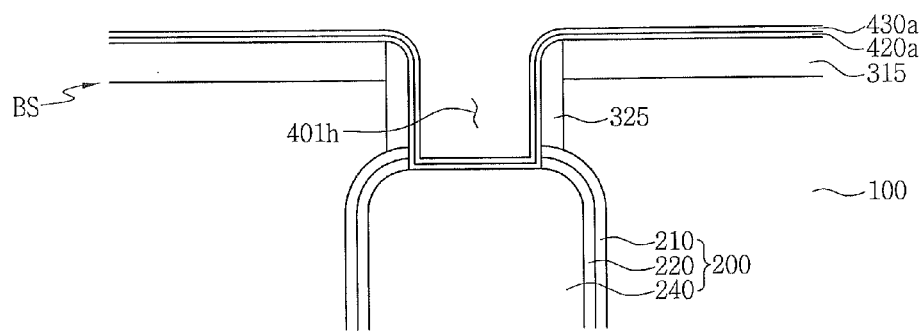

Referring now to FIG. 6B, a back side bonding barrier material layer 420a and a back side bonding seed material layer 430a may be conformally formed in a back side bonding via hole 401h and on a back side insulating layer 315. The back side bonding barrier material layer 420a and the back side bonding seed material layer 430a may be conformally formed on an upper surface of the back side insulating layer 315, an upper surface and sides of the back side bonding via spacer 325, and an exposed side of the TSV liner 210, a side of the TSV barrier layer 220, and an upper surface of the TSV core of the TSV structure 200.

Figure 6C:
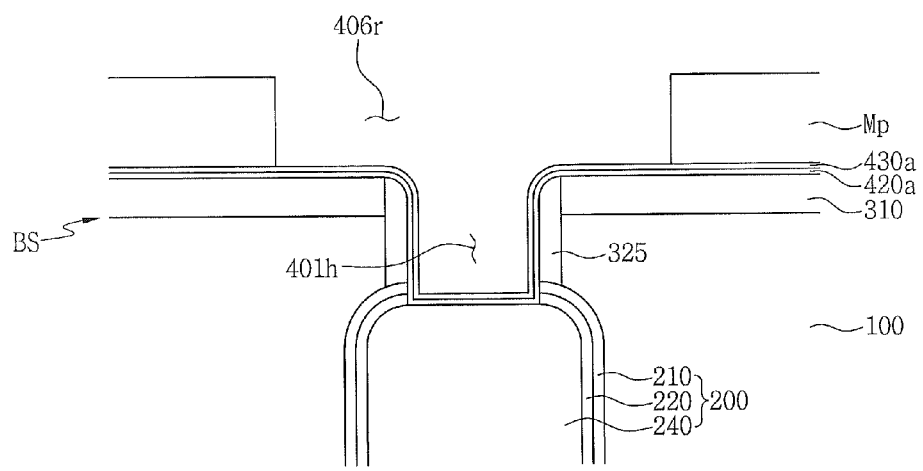

Referring now to FIG. 6C, a plating mask pattern Mp may be formed having a back side bonding recess 406r exposing the back side bonding via hole 401h. The plating mask pattern Mp may include photoresist.

Figure 6D:
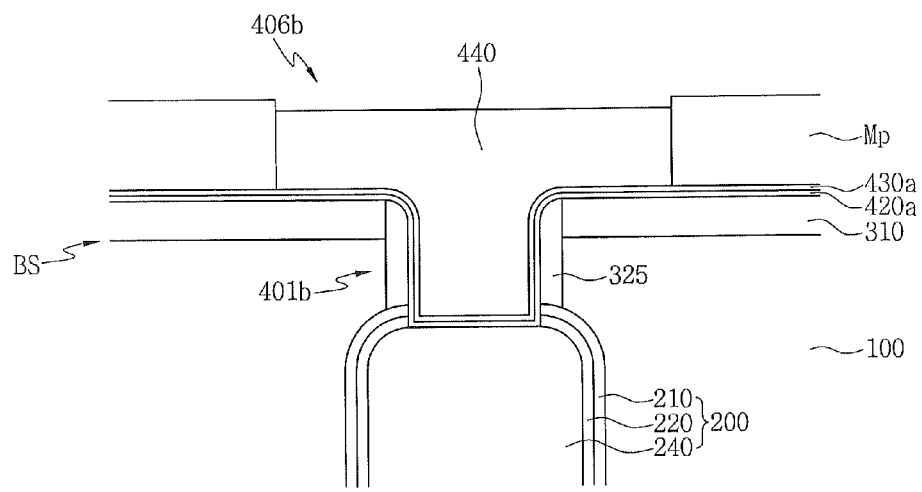

Referring now to FIG. 6D, a back side bonding interconnection layer 440 may be formed using, for example, a plating method. The back side bonding interconnection layer 440 may include a back side bonding via plug portion 401b filling the back side bonding via hole 401h, and a back side bonding interconnection portion 406b filling the back side bonding recess 406r.

Figure 6E:
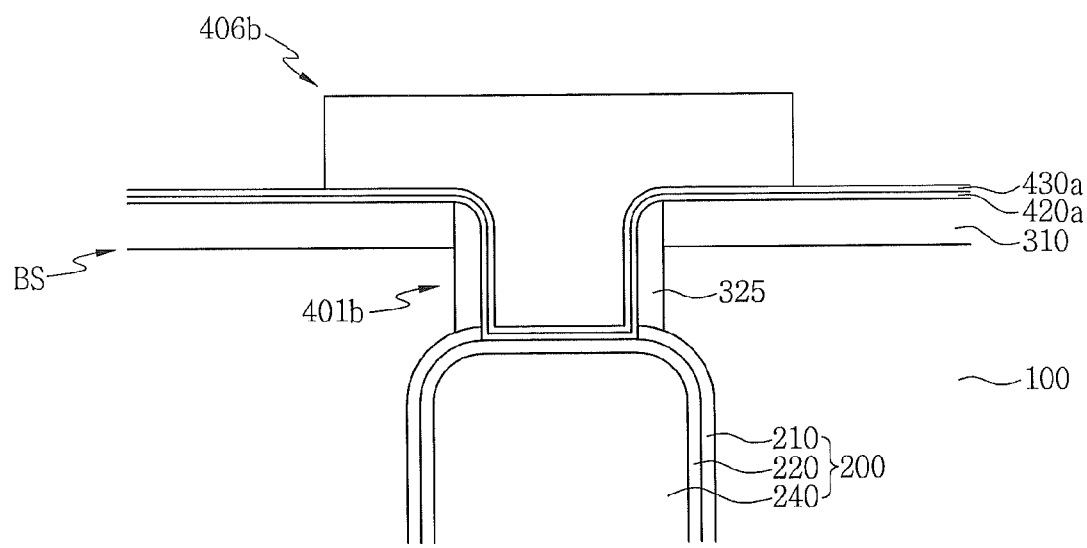
Figure 7A:
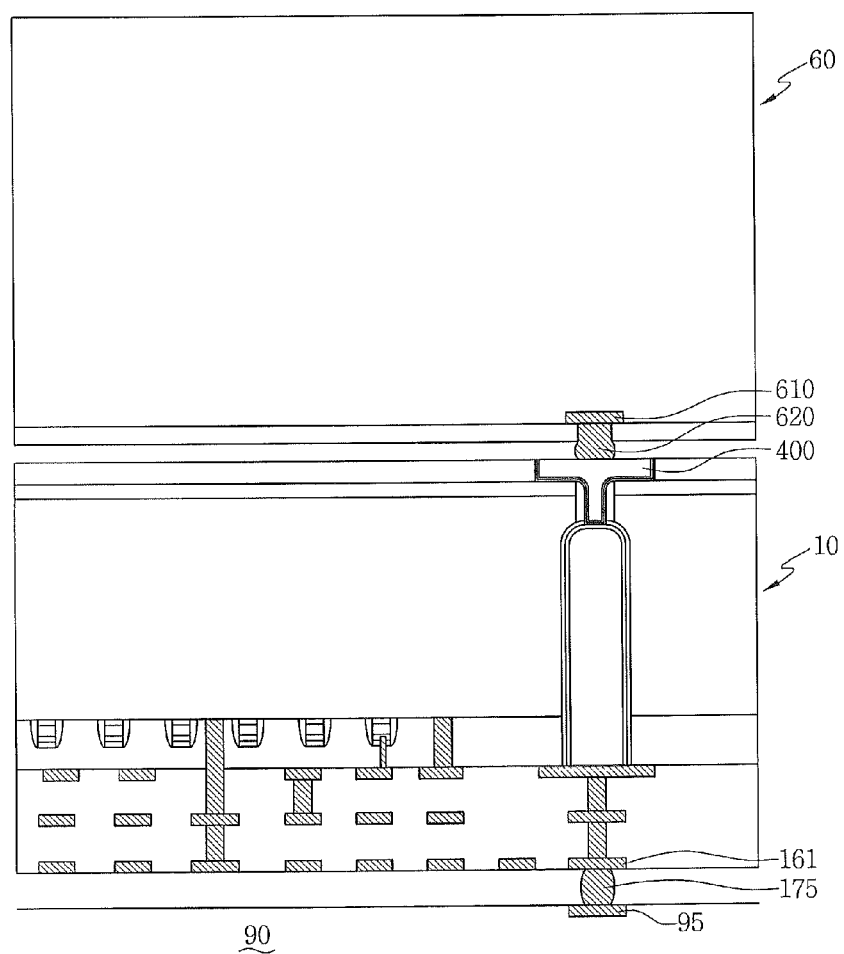
FIGS. 7A through 7D are cross-sections schematically illustrating semiconductor device stacking structures according to various embodiments of the inventive concept.
Figure 7B:
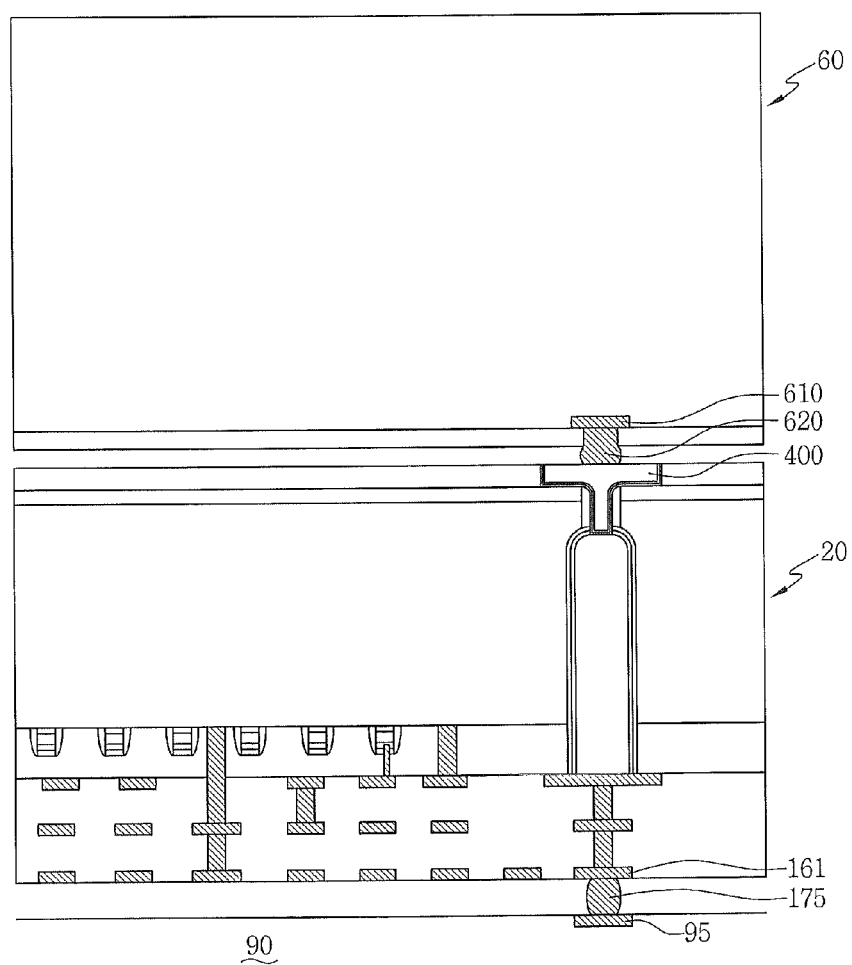
Figure 7C:
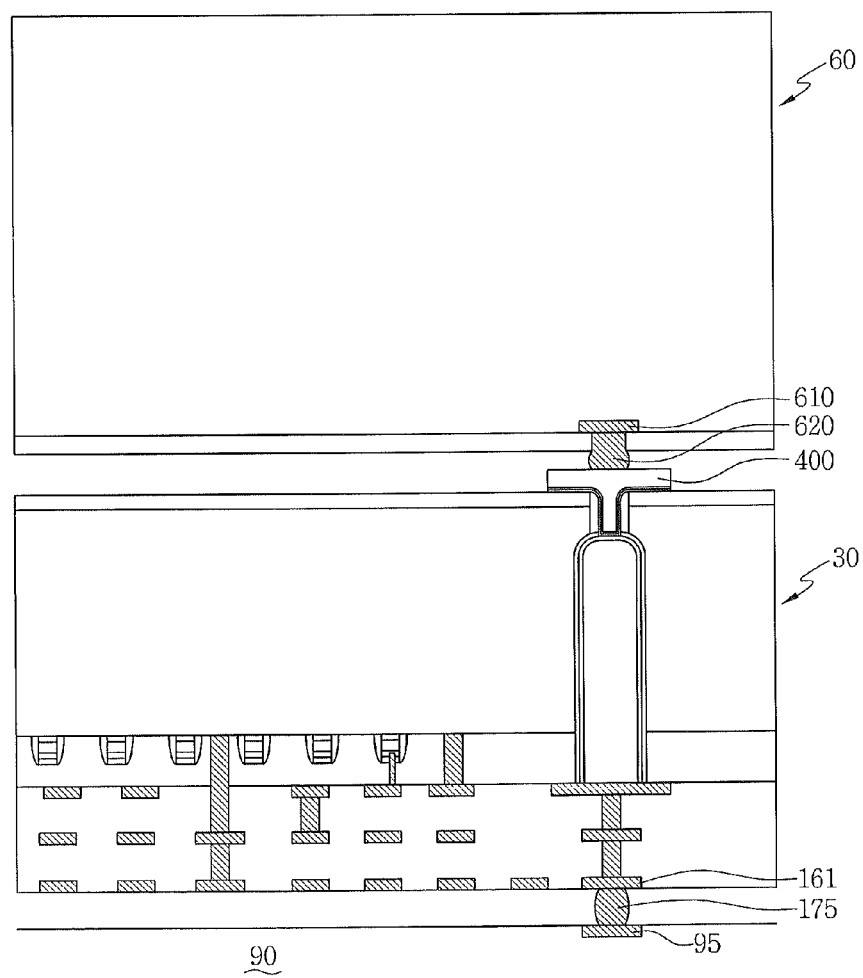
Figure 7D:
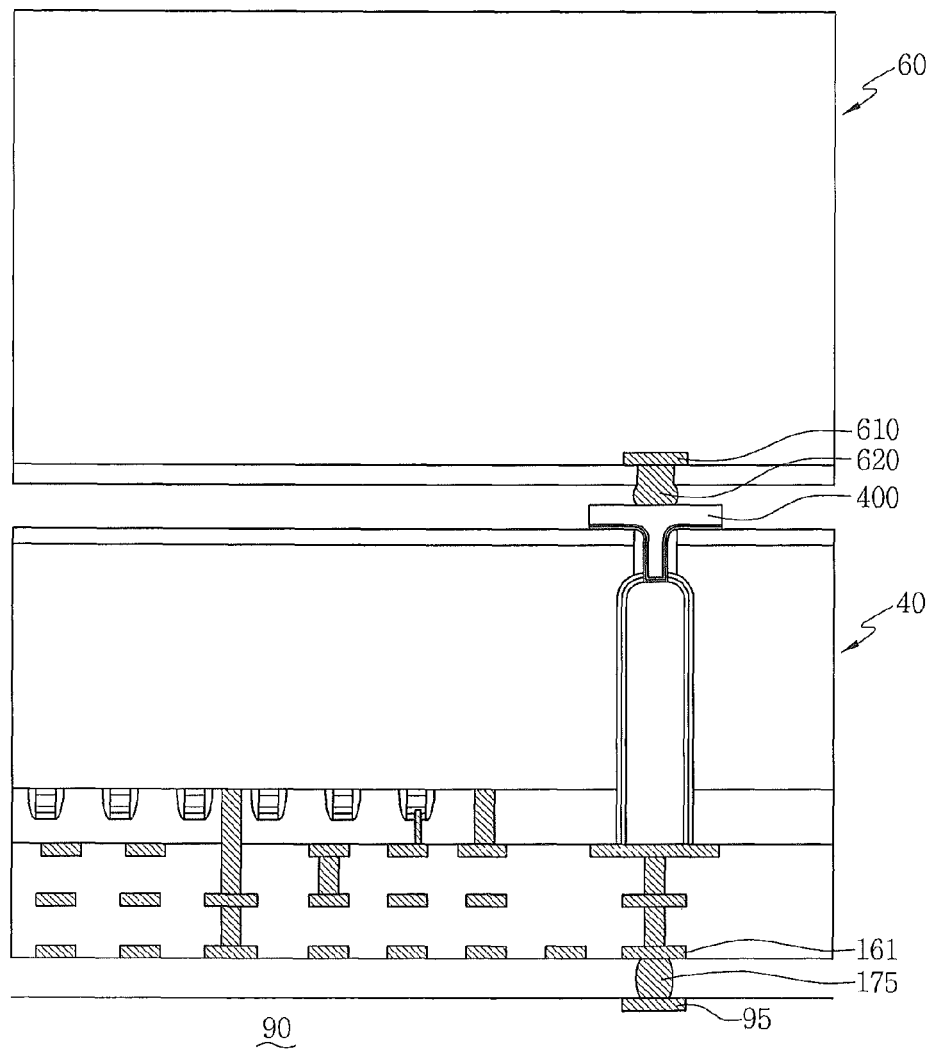

Referring now to FIG. 6E, the plating mask pattern Mp may be removed. During the removing process, the back side bonding seed material layer 430a on the back side insulating layer 315 may be exposed. Subsequently, referring back to FIG. 1H, the back side bonding seed material layer 430a and the back side bonding barrier material layer 420a may be removed from the back side insulating layer 315.

Referring now to FIGS. 7A to 7D, cross-sections schematically illustrating semiconductor device stacking structures 500a, 500b, 500c, and 500d according to various embodiments of the inventive concept will be discussed. It will be understood that each of the semiconductor device stacking structures 500a, 500b, 500c, and 500d according to various embodiments of the inventive concept may include each of lower semiconductor devices 10, 20, 30, and 40 and an upper semiconductor device 60 discussed above.

A back side bonding structure 400 of each of the lower semiconductor devices 10, 20, 30, and 40 is electrically connected to an I/O pad 610 of the upper semiconductor device 60 through a device bump 620. The lower semiconductor devices 10, 20, 30, and 40 and the upper semiconductor device 60 may have different characteristics from each other. For example, the lower semiconductor devices 10, 20, 30, and 40 may include logic semiconductor devices, and the upper semiconductor device 60 may include a memory semiconductor device. The device bump 620 may include a solder ball. Each of the semiconductor device stacking structures 500a, 500b, 500c, and 500d may be electrically connected to a bump land 95 of a circuit board 90 using a substrate bump 175. The circuit board 90 may include a packaging board, a card, or a motherboard. The substrate bump 175 may include a solder ball.

Figure 8A:
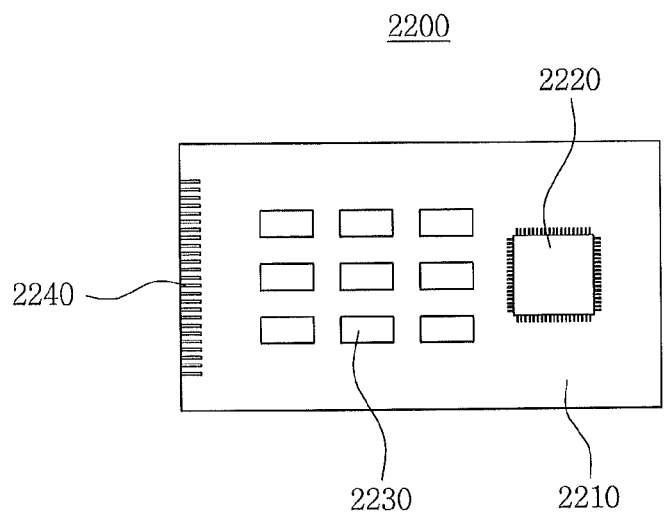
FIGS. 8A to 8D are block diagrams schematically illustrating a semiconductor module, an electronic system, and a mobile appliance including semiconductor devices according to various embodiments of the inventive concept.

Referring now to FIG. 8A, a block diagram conceptually illustrating a semiconductor module 2200 including at least one of the semiconductor devices 10, 20, 30, and 40 and the semiconductor device stacking structures 500a, 500b, 500c, and 500d according to various embodiments of the inventive concept will be discussed. As illustrated in FIG. 8A, the semiconductor module 2200 according to some embodiments of the inventive concept may include memory chips 2230 having at least one among the semiconductor devices 10, 20, 30, and 40 and the semiconductor device stacking structures 500a, 500b, 500c, and 500d according to various embodiments, which are mounted on a module substrate 2210. The semiconductor module 2200 may further include a microprocessor 2220 mounted on the module substrate 2210. I/O terminals 2240 may be disposed in at least one side of the module substrate 2210. The semiconductor module 2200 may include a memory card such as a solid state drive (SSD).

Figure 8B:
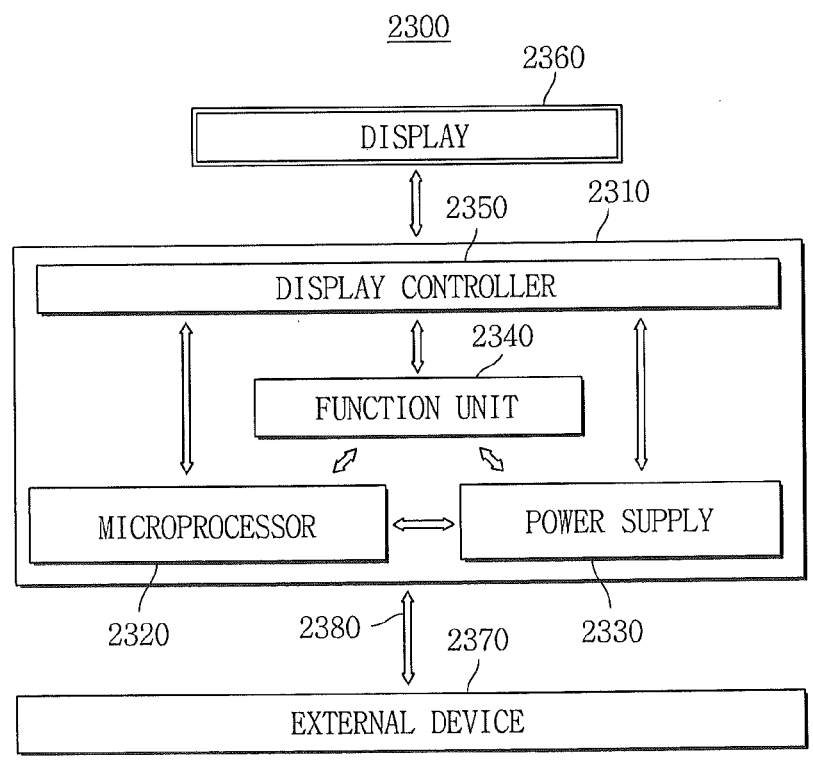

Referring now to FIG. 8B, a block diagram conceptually illustrating an electronic system 2300 including at least one among the semiconductor devices 10, 20, 30, and 40 and the semiconductor device stacking structures 500a, 500b, 500c, and 500d according to various embodiments of the inventive concept will be discussed. As illustrated in FIG. 8B, the semiconductor devices 10, 20, 30, and 40 and the semiconductor device stacking structures 500a, 500b, 500c, and 500d according to various embodiments of the inventive concept may be applied to the electronic system 2300. The electronic system 2300 may include a body 2310. The body 2310 may include a microprocessor 2320, a power supply 2330, a function unit 2340, and/or a display controller 2350. The body 2310 may be a system board or a motherboard including a printed circuit board (PCB). The microprocessor 2320, the power supply 2330, the function unit 2340, and the display controller 2350 may be installed or mounted on the body 2310. A display 2360 may be disposed on or outside the body 2310. For example, the display 2360 may be disposed on a surface of the body 2310 and display an image processed by the display controller 2350. The power supply 2330 may receive a constant voltage from an external power supply (not shown), divide the voltage into required voltage levels, and supply the divided voltages to the microprocessor 2320, the function unit 2340, the display controller 2350, and the like. The microprocessor 2320 may receive the voltage from the power supply 2330 and control the function unit 2340 and the display 2360. The function unit 2340 may perform various functions of the electronic system 2300. For example, when the electronic system 2300 is a mobile electronic appliance such as a portable phone, the function unit 2340 may include several components capable of wireless communication functions, such as the output of an image to the display 2360 or the output of a voice to a speaker, by dialing or communication with an external apparatus 2370. Also, when the electronic system 2300 includes a camera, the electronic system 2300 may serve as an image processor. In further embodiments, when the electronic system 2300 is connected to a memory card and the like to increase the capacity thereof, the function unit 2340 may be a memory card controller. The function unit 2340 may transmit/receive signals to/from the external apparatus 2370 through a wired or wireless communication unit 2380. Furthermore, when the electronic system 2300 requires a universal serial bus (USB) and the like to expand functions thereof, the function unit 2340 may serve as an interface controller. The semiconductor devices 10, 20, 30, and 40 or the semiconductor device stacking structures 500a, 500b, 500c, and 500d described in various embodiments of the inventive concept may be included in any one of the microprocessor 2320 and the function unit 2340.

Figure 8C:
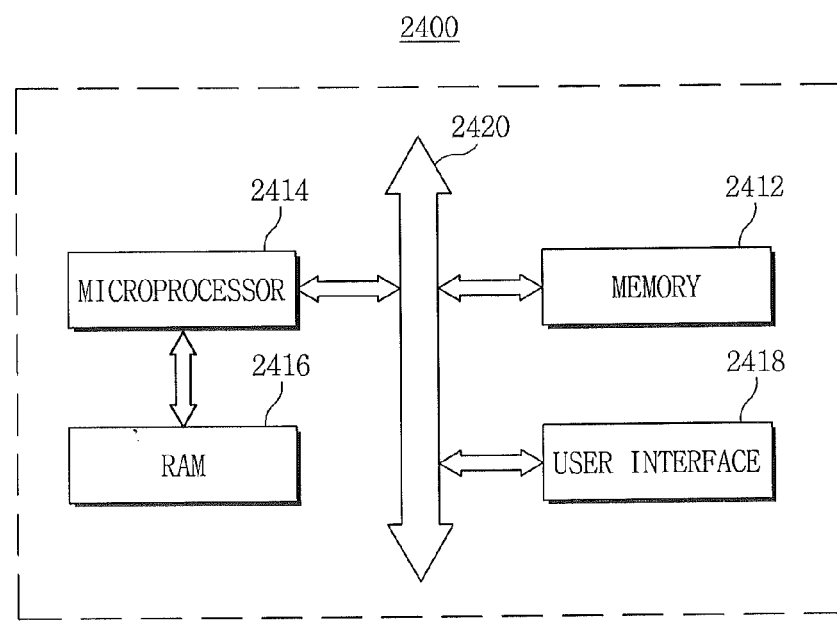

Referring now to FIG. 8C, a block diagram schematically illustrating an electronic system 2400 including at least one among the semiconductor devices 10, 20, 30, and 40 and the semiconductor device stacking structures 500a, 500b, 500c, and 500d according to various embodiments of the inventive concept will be discussed. As illustrated in FIG. 8C, the electronic system 2400 may include at least one among the semiconductor devices 10, 20, 30, and 40 and the semiconductor device stacking structures 500a, 500b, 500c, and 500d according to various embodiments of the inventive concept. The electronic system 2400 may be used in fabricating mobile apparatuses or computers. For example, the electronic system 2400 may include a memory system 2412, a microprocessor 2414, a random access memory (RAM) 2416, and a user interface 2418 performing data communication using a bus 2420. The microprocessor 2414 may program and control the electronic system 2400. The RAM 2416 may be used as an operation memory of the microprocessor 2414. For example, the microprocessor 2414 or the RAM 2416 may include at least one among the semiconductor devices 10, 20, 30, and 40 and the semiconductor device stacking structures 500a, 500b, 500c, and 500d according to various embodiments of the inventive concept. The microprocessor 2414, the RAM 2416, and/or other components may be assembled in a single package. The user interface 2418 may be used to input/output data to/from the electronic system 2400. The memory system 2412 may store operational codes of the microprocessor 2414, data processed by the microprocessor 2414, or external input data. The memory system 2412 may include a controller and a memory.

Figure 8D:
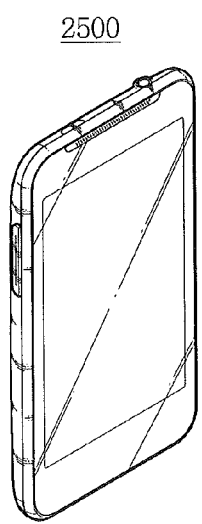

Referring now to FIG. 8D, a diagram illustrating a mobile apparatus 2500 including at least one among the semiconductor devices 10, 20, 30, and 40 and the semiconductor device stacking structures 500a, 500b, 500c, and 500d according to various embodiments of the inventive concept will be discussed. The mobile apparatus 2500 may include mobile phones or tablet personal computers (PCs). In addition, at least one among the semiconductor devices 10, 20, 30, and 40 and the semiconductor device stacking structures 500a, 500b, 500c, and 500d according to various embodiments of the inventive concept may be used in portable computers such as laptop computers, MPEG-1 audio layer 3 (MP3) players, MP4 players, navigation apparatuses, SSDs, desktop computers, automobiles, and home electronic appliances in addition to the mobile phones or the tablet PCs.

The semiconductor devices according to various embodiment of the inventive concept may include a TSV structure having a back side end recessed lower than a back side of a substrate. Therefore, the back side end of the TSV structure may be protected from an etching process, a removing process, a grinding process, a polishing process, a planarization process, or the like, which physically or chemically attacks the back side of the substrate. When the back side end of the TSV structure is physically or chemically attacked, the TSV may be directly contaminated, or a portion of the TSV structure may negatively influence operation of other elements of the device. For example, electrical conductivity of the TSV structure or adhesion to adjacent insulating layers may be degraded. Furthermore, the TSV structure may be partially damaged and cause, for example, an electrical short-circuit or open-circuit. Therefore, yield, performance, and life cycle of the semiconductor device may be reduced.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device comprising:
an internal circuit on a front side of a substrate, the substrate defining a through-silicon via (TSV) structure extending vertically therein;
a back side insulating layer on a back side of the substrate; and
a back side bonding structure on the back side insulating layer,
wherein the TSV structure includes a front side end on a front side of the substrate and contacts the internal circuit and a back side end extending toward the back side of the substrate;
wherein the back side bonding structure comprises a back side bonding interconnection portion on the back side insulating layer defining a back side bonding via hole therein and a back side bonding via plug portion in the back side bonding via hole in the back side insulating layer connected to the back side end of the TSV structure;
wherein the back side bonding structure includes a back side bonding interconnection layer and a back side bonding barrier layer;

wherein the TSV structure includes a TSV core, a TSV barrier layer surrounding the TSV core, and a TSV liner surrounding the TSV barrier layer, the TSV barrier layer completely surrounding a side and a back side end of the TSV core, and the TSV liner entirely surrounding a side of the TSV barrier layer and partially exposing the TSV barrier layer on the back side end of the TSV core; and wherein the exposed TSV barrier layer is in direct contact with the back side bonding barrier layer.

2. The semiconductor device of claim 1:
wherein the back side bonding interconnection layer and the TSV core include copper (Cu);
wherein the back side bonding barrier layer and the TSV barrier layer include one of titanium (Ti) and tantalum (Ta); and
wherein the TSV liner includes silicon oxide.

3. The semiconductor device of claim 1, wherein the back side bonding barrier layer surrounds a lower surface and sides of the back side bonding interconnection portion and a lower surface and sides of the back side bonding via plug portion, and exposes an upper surface of the back side bonding interconnection portion.

4. The semiconductor device of claim 1, wherein the back side insulating layer includes:
a lower back side insulating layer on the back side of the substrate and configured to define the back side bonding via plug portion; and
an upper back side insulating layer on the lower back side insulating layer and configured to define the back side bonding interconnection portion.

5. The semiconductor device of claim 4, wherein the substrate and the lower back side insulating layer define the back side bonding via hole, and the back side bonding via plug portion is in the back side bonding via hole.

6. The semiconductor device of claim 1:
wherein the back side bonding interconnection portion includes a TSV connection portion, a pad portion, and a interconnection portion connecting the TSV connection portion and the pad portion; and
wherein the TSV connection portion is on the back side bonding via plug portion.

7. The semiconductor device of claim 1, wherein the TSV structure, the back side bonding via plug portion, and the back side bonding interconnection portion are vertically aligned.

8. The semiconductor device of claim 1, further comprising:
transistors on the front side of the substrate, the transistors including gate electrodes;
contact plugs electrically connecting the substrate and the gate electrodes of the transistors to the internal circuit;
a lower interlayer insulating layer covering the transistors;
an upper interlayer insulating layer covering the internal circuit; and
a front side redistribution structure on the upper interlayer insulating layer.

9. The semiconductor device of claim 8, wherein the internal circuit includes an internal via having a pillar shape, an internal interconnection having a mesa shape, and a TSV pad contacting the front side end of the TSV structure.

10. The semiconductor device of claim 9, wherein the front side redistribution structure includes a front side redistribution pad and a front side redistribution interconnection at a same level.

11. A semiconductor device comprising:
an internal circuit on a front side of a substrate, the substrate defining a through-silicon via (TSV) structure extending vertically therein;
a back side insulating layer on a back side of the substrate; and
a back side bonding structure on the back side insulating layer,
wherein the TSV structure includes a front side end on a front side of the substrate and contacts the internal circuit and a back side end extending toward the back side of the substrate;
wherein the back side bonding structure comprises a back side bonding interconnection portion on the back side insulating layer defining a back side bonding via hole therein and a back side bonding via plug portion in the back side bonding via hole in the back side insulating layer connected to the back side end of the TSV structure;
wherein the back side insulating layer includes:
a lower back side insulating layer on the back side of the substrate and configured to define the back side bonding via plug portion; and
an upper back side insulating layer on the lower back side insulating layer and configured to define the back side bonding interconnection portion;
wherein the substrate and the lower back side insulating layer define the back side bonding via hole, and the back side bonding via plug portion is in the back side bonding via hole; and
wherein the semiconductor device further comprises:
an insulating back side bonding via spacer on an inner wall of the back side bonding via hole, wherein the insulating back side bonding via spacer directly contacts the back side bonding barrier layer.

12. The semiconductor device of claim 11, wherein the upper back side insulating layer and the insulating back side bonding via spacer include a same material.

13. A semiconductor device comprising:
an internal circuit on a front side of a substrate, the substrate defining a through-silicon via (TSV) structure extending vertically therein and including a front side end at a first adjacent to the front side of the substrate and contacts the internal circuit and a back side end in the substrate extending towards a back side of the substrate,
a front side redistribution pad on the internal circuit of the substrate;
a back side insulating layer and a back side bonding structure having a T-shaped longitudinal cross-section on the back side of the substrate,
wherein the back side bonding structure includes:
a back side bonding via plug portion which corresponds to a vertical portion of the T-shape cross-section, is in a backside bonding via hole defined by the back side insulating layer and the substrate and contacts the back side end of the TSV structure; and
a back side bonding interconnection portion which corresponds to a horizontal portion of the T-shape cross-section; and
a back side bonding via spacer on an inner wall of the back side bonding via hole,
wherein the back side bonding structure includes a back side bonding interconnection layer and a conductive back side bonding barrier layer; and
wherein the back side insulating layer includes a lower back side insulating layer on the back side of the substrate and configured to define the back side bonding via plug portion; and an upper back side insulating layer on the lower back side insulating layer and configured to define the back side bonding interconnection portion, wherein the substrate and the lower back side insulating layer define the back side bonding via hole, and the back side bonding via plug portion is in the back side bonding via hole, and wherein the insulating back side bonding via spacer directly contacts the back side bonding barrier layer.

14. The semiconductor device of claim 13, wherein the back side bonding via plug portion extends vertically into the back side insulating layer and the substrate, is defined by the substrate and the back side insulating layer and contacts the TSV structure.

15. A semiconductor device comprising:

a semiconductor substrate;

a through-silicon via (TSV) structure defined by the semiconductor substrate, an open end of the TSV structure adjacent a front side of the substrate and a back side of the TSV structure extending into the substrate towards, but not to, a surface of a back side of the substrate such that the back side of the TSV structure is protected from damage due to subsequent processes;

an internal circuit on the front side of the substrate, wherein the open end of the TSV structure contacts the internal circuit;

a back side insulating layer on the back side of the substrate; and a back side bonding structure on the back side insulating layer, wherein the back side bonding structure comprises a back side bonding interconnection portion on the back side insulating layer defining a back side bonding via hole therein and a back side bonding via plug portion in the back side bonding via hole in the back side insulating layer connected to a back side end of the TSV structure;

wherein the back side bonding structure includes a back side bonding interconnection layer and a back side bonding barrier layer;

wherein the TSV structure includes a TSV core, a TSV barrier layer surrounding the TSV core, and a TSV liner surrounding the TSV barrier layer, the TSV barrier layer completely surrounding a side and a back side end of the TSV core, and the TSV liner entirely surrounding a side of the TSV barrier layer and partially exposing the TSV barrier layer on the back side end of the TSV core; and wherein the exposed TSV barrier layer is in direct contact with the back side bonding barrier layer.

16. The semiconductor device of claim 15:

wherein the back side bonding interconnection layer and the TSV core include copper (Cu);

wherein the back side bonding barrier layer and the TSV barrier layer include one of titanium (Ti) and tantalum (Ta); and wherein the TSV liner includes silicon oxide.

17. The semiconductor device of claim 15, wherein the back side bonding barrier layer surrounds a lower surface and sides of the back side bonding interconnection portion and a lower surface and sides of the back side bonding via plug portion, and exposes an upper surface of the back side bonding interconnection portion.

* * * * *